(12) United States Patent
Kuboi

(10) Patent No.: US 10,790,125 B2
(45) Date of Patent: Sep. 29, 2020

(54) DAMAGE PREDICTION METHOD AND SEMICONDUCTOR PROCESSING SYSTEM

(71) Applicant: SONY SEMICONDUCTOR SOLUTIONS CORPORATION, Kanagawa (JP)

(72) Inventor: Nobuyuki Kuboi, Kanagawa (JP)

(73) Assignee: SONY SEMICONDUCTOR SOLUTIONS CORPORATION, Kanagawa (JP)

(*) Notice: Subject to any disclaimer, the term of this patent is extended or adjusted under 35 U.S.C. 154(b) by 0 days.

(21) Appl. No.: 16/338,923

(22) PCT Filed: Sep. 6, 2017

(86) PCT No.: PCT/JP2017/032122
§ 371 (c)(1),
(2) Date: Apr. 2, 2019

(87) PCT Pub. No.: WO2018/074087
PCT Pub. Date: Apr. 26, 2018

(65) Prior Publication Data
US 2019/0237310 A1    Aug. 1, 2019

(30) Foreign Application Priority Data

Oct. 21, 2016  (JP) ................ 2016-206709

(51) Int. Cl.
*G06F 15/00* (2006.01)
*G01B 15/04* (2006.01)
(Continued)

(52) U.S. Cl.
CPC .. *H01J 37/32972* (2013.01); *H01J 37/32926* (2013.01); *H01L 21/31116* (2013.01);
(Continued)

(58) Field of Classification Search
CPC ..... H01L 21/67288; H01L 2224/48091; H01L 22/12; H01L 21/67253; H01L 22/20;
(Continued)

(56) References Cited

U.S. PATENT DOCUMENTS

2013/0013253 A1    1/2013   Samukawa et al.

FOREIGN PATENT DOCUMENTS

EP          2549523 A1       1/2013
KR    10-2012-0139802 A     12/2012
(Continued)

OTHER PUBLICATIONS

Tian, et al., "Controlling VUV photon fluxes in pulsed inductively coupled Ar/Cl2 plasmas and potential applications in plasma etching", Plasma Sources Science and Technology, vol. 26, No. 2, Jan. 19, 2017, 23 pages.

(Continued)

*Primary Examiner* — Mesfin T Asfaw
(74) *Attorney, Agent, or Firm* — Chip Law Group

(57) ABSTRACT

[Object] To predict the damage distribution of a workpiece caused by ions and light from plasma more accurately within a practical computation time. [Solution] Provided is a damage prediction method including: using an operation apparatus to calculate, from fluxes of ions and light generated by plasma, fluxes of ions and light propagated through a pattern of a workpiece including a processing object, on the basis of the pattern; calculating, from the fluxes of ions and light propagated through the pattern, fluxes of ions and light arriving at a surface of the processing object, by ray tracing; and calculating, from the fluxes of ions and light arriving at the surface of the processing object, a damage distribution of the processing object.

16 Claims, 20 Drawing Sheets

(51) Int. Cl.
*H01J 37/32* (2006.01)
*H01L 21/311* (2006.01)
*H05H 1/00* (2006.01)
*H05H 1/46* (2006.01)

(52) U.S. Cl.
CPC ........ *H01L 21/31144* (2013.01); *H05H 1/00* (2013.01); *H05H 1/46* (2013.01); *H01J 2237/3321* (2013.01); *H01J 2237/3341* (2013.01)

(58) Field of Classification Search
CPC ............. H01L 21/02057; H01L 21/027; H01L 21/0274; H01L 22/14; H01L 51/56; H01L 21/02063; H01L 21/02164; H01L 21/02274; H01L 21/0228; H01L 21/02505; H01L 21/0254; H01L 21/26506; H01L 21/304; H01L 21/31116; H01L 21/31144; H01L 21/3247; H01L 21/67259; H01L 21/67778; H01L 21/76254; H01L 22/10; H01L 22/30; H01L 23/13; H01L 23/15; H01L 23/36; H01L 24/03; H01L 24/12; H01L 25/0657; H01L 27/0605
See application file for complete search history.

(56) References Cited

FOREIGN PATENT DOCUMENTS

| | | |
|---|---|---|
| TW | 201142914 A | 12/2011 |
| WO | 2011/115023 A1 | 9/2011 |
| WO | 2016/132759 A1 | 8/2016 |

OTHER PUBLICATIONS

Jinnai, et al., "Prediction of UV spectra and UV-radiation damage in actual plasma etching processes using on-wafer monitoring technique", Journal of Applied Physics, vol. 107, 2010, pp. 043302-1 to 043302-2.

International Search Report and Written Opinion of PCT Application No. PCT/JP2017/032122, dated Nov. 7, 2017, 09 pages of ISRWO.

Jinnai, et al., "Prediction of UV Spectra and UV-Radiation Damage in Actual Plasma Etching Processes Using On-Wafer Monitoring Technique", 2010 American Institute of Physics, Journal of Applied Physics, vol. 107, Feb. 19, 2010, 06 pages.

Tian, et al., "Controlling VUV Photon Fluxes in Pulsed Inductively Coupled Ar/Cl2 Plasmas and Potential Applications in Plasma Etching", 2017 IOP Publishing Ltd, 23 pages.

Jinnai, et al., "Prediction of UV Spectra and UV-Radiation Damage in Actual Plasma Etching Processes Using On-Wafer Monitoring Technique", 2010 American Institute of Physics, Journal of Applied Physics, 06 pages.

DAMAGE PREDICTION METHOD AND SEMICONDUCTOR PROCESSING SYSTEM

CROSS REFERENCE TO RELATED APPLICATIONS

This application is a U.S. National Phase of International Patent Application No. PCT/JP2017/032122 filed on Sep. 6, 2017, which claims priority benefit of Japanese Patent Application No. JP 2016-206709 filed in the Japan Patent Office on Oct. 21, 2016. Each of the above-referenced applications is hereby incorporated herein by reference in its entirety.

TECHNICAL FIELD

The present disclosure relates to a damage prediction method, a program, and a semiconductor processing system.

BACKGROUND ART

These days, improvements in the characteristics of semiconductor elements included in an information processing circuit are being required more and more with the progress of information society.

Here, to improve the characteristics of a semiconductor element, it is important to reduce damage (for example, crystal defects, etc.) to the semiconductor element that occurs during a plasma process in the manufacturing process of the semiconductor element.

Damage to a semiconductor element in a plasma process is specifically caused by high-energy ions, light (for example, vacuum ultraviolet rays, ultraviolet rays, etc.), and the like incident on a workpiece from plasma. These ions and rays of light pass through, for example, an insulating film with a wide band gap of SiN, $SiO_2$, or the like, and consequently form defects in an organic film, a silicon substrate, etc. below the insulating film.

Thus, to develop a high-performance semiconductor element, it is very important to predict the damage distribution of a workpiece due to ions and light and control the damage distribution in a plasma process.

For example, Non-Patent Literature 1 below proposes a method in which the damage distribution in a workpiece is predicted using the Monte Carlo method while light of vacuum ultraviolet rays and ultraviolet rays is modeled as a group of particles.

CITATION LIST

Non-Patent Literature

Non-Patent Literature 1: Tian and Kushner, "Controlling Correlations Between Ion and UV/VUV Photon Fluxes in Low Pressure Plasma Materials Processing," [online], Oct. 30, 2012, AVS 59th International Symposium & Exhibition, [searched on Sep. 29, 2016], the Internet <URL: https://www.src.org/library/publication/p065684/>

DISCLOSURE OF INVENTION

Technical Problem

However, light has not only properties as particles but also properties as wave motion. Hence, in the technology disclosed in Non-Patent Literature 1, which neglects diffraction, etc. resulting from the wave nature of light, it has been difficult to accurately predict the propagation of light to the inside of a pattern, which propagation depends on the pattern configuration of a workpiece.

On the other hand, as a method for predicting the propagation of light while taking wave nature into account, for example, it may be possible to use the finite-difference time-domain (FDTD) method to solve Maxwell's equations of light incident on a workpiece. However, this method involves solving Maxwell's equations in all the regions of the workpiece in units of time steps, and consequently has massive computational complexity. Therefore, in this method, it has been difficult to compute the damage distribution of the workpiece caused by ions and light within a practical computation time.

Thus, the present disclosure proposes a new and improved damage prediction method, a new and improved program, and a new and improved semiconductor processing system in which the damage distribution of a workpiece caused by ions and light derived from plasma can be predicted more accurately within a practical computation time.

Solution to Problem

According to the present disclosure, there is provided a damage prediction method including: using an operation apparatus to calculate, from fluxes of ions and light generated by plasma, fluxes of ions and light propagated through a pattern of a workpiece including a processing object, on the basis of the pattern; calculating, from the fluxes of ions and light propagated through the pattern, fluxes of ions and light arriving at a surface of the processing object, by ray tracing; and calculating, from the fluxes of ions and light arriving at the surface of the processing object, a damage distribution of the processing object.

Moreover, according to the present disclosure, there is provided a damage prediction method including: using an operation apparatus to calculate, from fluxes of ions and light generated by plasma, fluxes of ions and light arriving at a surface of a processing object; and performing, from the fluxes of ions and light arriving at the surface of the processing object, operations of damage due to ions and light and damage due to light, on the basis of entry lengths from the surface of the processing object, and calculating a damage distribution of the processing object.

Moreover, according to the present disclosure, there is provided a damage prediction method including: using an operation apparatus to calculate, from fluxes of ions and light generated by plasma, fluxes of ions and light arriving at a surface of a processing object; and calculating, from the fluxes of ions and light arriving at the surface of the processing object, a distribution of damage to the processing object, a direction of a normal vector of the flux of light arriving at the surface of the processing object being the same as a direction of a normal vector of the flux of ions arriving at the surface of the processing object.

Moreover, according to the present disclosure, there is provided a program for causing a computer to function as: an incident flux operation unit configured to calculate, from fluxes of ions and light generated by plasma, fluxes of ions and light propagated through a pattern of a workpiece including a processing object, on the basis of the pattern; a processing surface flux operation unit configured to calculate, from the fluxes of ions and light propagated through the pattern, fluxes of ions and light arriving at a surface of the processing object, by ray tracing; and a damage operation unit configured to calculate, from the fluxes of ions and light arriving at the surface of the processing object, a distribution of damage to the processing object.

Moreover, according to the present disclosure, there is provided a semiconductor processing system including: an incident flux operation unit configured to calculate, from fluxes of ions and light generated by plasma, fluxes of ions and light propagated through a pattern of a workpiece including a processing object, on the basis of the pattern; a processing surface flux operation unit configured to calculate, from the fluxes of ions and light propagated through the pattern, fluxes of ions and light arriving at a surface of the processing object, by ray tracing; and a damage operation unit configured to calculate, from the fluxes of ions and light arriving at the surface of the processing object, a distribution of damage to the processing object.

According to the present disclosure, light is treated as a wave and diffraction at an opening of a workpiece can be taken into account; thus, the damage distribution of the workpiece can be computed more accurately. Further, according to the present disclosure, damage to a workpiece can be computed by using different models for a region where both ions and light enter and a region where only light enters; thus, the damage distribution of the workpiece can be computed more accurately.

Advantageous Effects of Invention

As described above, according to the present disclosure, the damage distribution of a workpiece caused by ions and light derived from plasma can be predicted more accurately within a practical computation time.

Note that the effects described above are not necessarily limitative. With or in the place of the above effects, there may be achieved any one of the effects described in this specification or other effects that may be grasped from this specification.

MODE(S) FOR CARRYING OUT THE INVENTION

Figure 1:
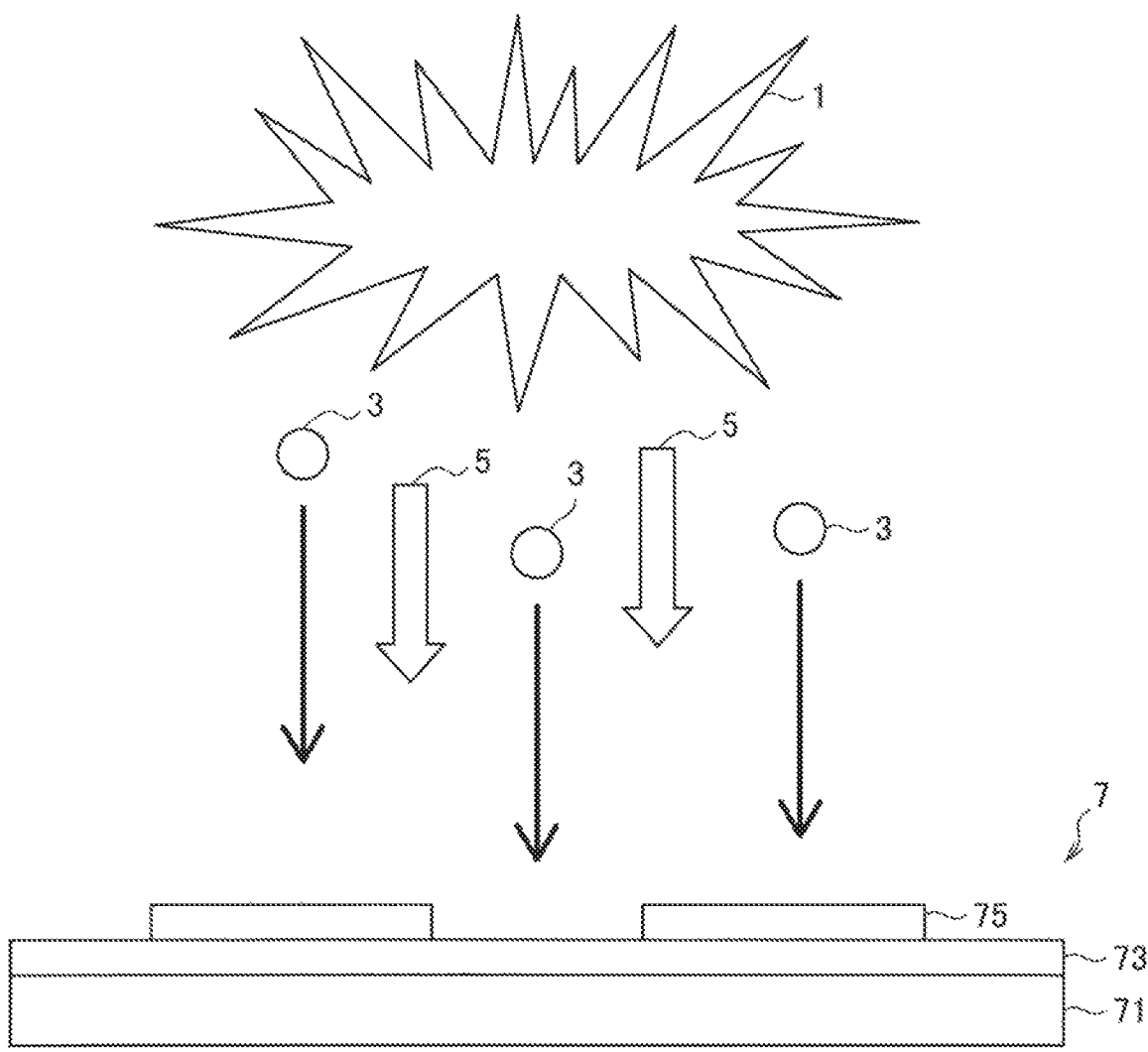
FIG. 1 is an explanatory diagram describing a processing process dealt with in a damage prediction method according to a first embodiment of the present disclosure.

Hereinafter, (a) preferred embodiment(s) of the present disclosure will be described in detail with reference to the appended drawings. Note that, in this specification and the appended drawings, structural elements that have substantially the same function and structure are denoted with the same reference numerals, and repeated explanation of these structural elements is omitted.

Note that the description is given in the following order.
1. First Embodiment
1.1. Overview
1.2. Flow of damage prediction method
1.3. Specific examples
2. Second Embodiment
2.1. Overview
2.2. Configuration example of damage prediction apparatus
2.3. Hardware configuration example
3. Third Embodiment
3.1. Overview
3.2. Configuration example of semiconductor processing system
4. Conclusions

1. FIRST EMBODIMENT (1.1. Overview)

First, an overview of a damage prediction method according to a first embodiment of the present disclosure is described with reference to FIG. 1. FIG. 1 is an explanatory diagram describing a processing process dealt with in a damage prediction method according to the first embodiment of the present disclosure.

As shown in FIG. 1, the damage prediction method according to the present embodiment is a method for predicting the damage of a workpiece 7 in a processing process in which molecules or atoms of a gas are ionized using plasma 1, and ions 3 and light 5 generated are projected on the workpiece 7.

Specifically, the damage prediction method according to the present embodiment deals with a processing process in which ions 3 and light 5 generated by plasma 1 are caused to be incident on the workpiece 7, and a region of the workpiece 7 not covered with a mask 75 is subjected to film formation, etching, etc. by incident ions 3. Note that the workpiece 7 is, for example, a stacked body or the like in which a processing film 73 or the like that is a processing object is formed on a substrate 71 and further the mask 75 is provided on the processing film 73.

That is, the processing process dealt with by the damage prediction method according to the present embodiment is a fine processing process used for the manufacturing of a semiconductor element; for example, is plasma etching, physical vapor deposition (PVD), chemical vapor deposition (CVD), plasma ashing, a plasma cleaning process, or the like. Further, the workpiece 7 may be an intermediate body in the manufacturing process of a semiconductor element.

The plasma 1 is formed by supplying high-frequency waves or microwaves to a gas or the like and causing the gas or the like to electrically discharge. Further, in the interior of the plasma 1, atoms or molecules of the gas are electrically dissociated and ions 3 are formed. The plasma 1 may be plasma formed by any known method, and may be high-frequency plasma, electron cyclotron resonance (ECR) plasma, capacitively coupled plasma, inductively coupled plasma, helicon wave plasma, ultra-high frequency (UHF) or very high frequency (VHF) plasma, or the like.

The ions 3 are a substance produced by atoms or molecules of a gas being electrically dissociated and ionized. The gas for forming ions 3 may be a material gas of a layer that is formed as a film on the processing film 73, may be an etching gas for etching the processing film 73, may be an ashing gas for removing the mask 75, or may be a cleaning gas for cleaning the surface of the workpiece 7, for example.

The light 5 is light generated by plasma 1; for example, is ultraviolet rays and vacuum ultraviolet rays. These rays of light 5 have high energy; therefore, are not absorbed by an insulating layer of SiN, $SiO_2$, or the like with a relatively wide band gap, and arrive at the substrate 71 below the processing film 73 or the interface between the substrate 71 and the processing film 73; consequently, give damage to the processing film 73 or the substrate 71. Defects or the like are formed in the processing film 73 or the substrate 71 that has received damage due to light 5, and therefore the characteristics of a semiconductor element formed using the processing film 73 or the substrate 71 are reduced.

Note that the light 5 is not limited to ultraviolet rays or vacuum ultraviolet rays described above, and may be visible light, infrared rays, or the like. In the technology according to the present disclosure, the light 5 refers to an electromagnetic wave having both particle nature and wave nature, and includes visible light, infrared rays, radio waves, radioactive rays, and the like.

As the substrate 71, a known substrate may be used as long as it is a substrate used for the formation of a semiconductor element. The substrate 71 may be, for example, a metal substrate, a semiconductor substrate, a glass substrate, a resin substrate, or the like. In a case where the substrate 71 is a metal substrate or a semiconductor substrate, light 5 forms defects in the crystal structure of the substrate 71, and consequently reduces the characteristics of a semiconductor element formed on the substrate 71. Further, in a case where the substrate 71 is a glass substrate or a resin substrate, light 5 gives damage to chemical bonds of the material of the substrate 71, and consequently degrades the strength, etc. of the substrate 71.

The processing film 73 corresponds to a processing object, and is a film that is subjected to, for example, film formation, etching, ashing, cleaning, etc. by ions 3 generated by plasma 1. The processing film 73 may be an insulating layer of SiN, $SiO_2$, or the like, may be a metal layer or a compound semiconductor layer containing silicon (Si), zinc (Zn), gallium (Ga), titanium (Ti), tungsten (W), copper (Cu), aluminum (Al), or the like, or may be a resin layer of an imide resin, an acrylic resin, a novolac resin, or the like, for example. That is, the processing film 73 may be any film as long as it is a film used in a semiconductor element.

The mask 75 is, for example, a patterned layer of a resist layer, an insulating layer, a metal layer, or the like. The mask 75 is used for the patterning of the processing film 73 in a film formation process or an etching process, for example. However, the mask 75 may not be used depending on the kind of the plasma process.

In the damage prediction method according to the present embodiment, the damage distribution of the workpiece 7 (in particular, the processing film 73) caused by ions 3 and light 5 can be calculated more accurately in a practical computation time in a processing process using plasma 1 like that described above.

(1.2. Flow of Damage Prediction Method)

Figure 2:
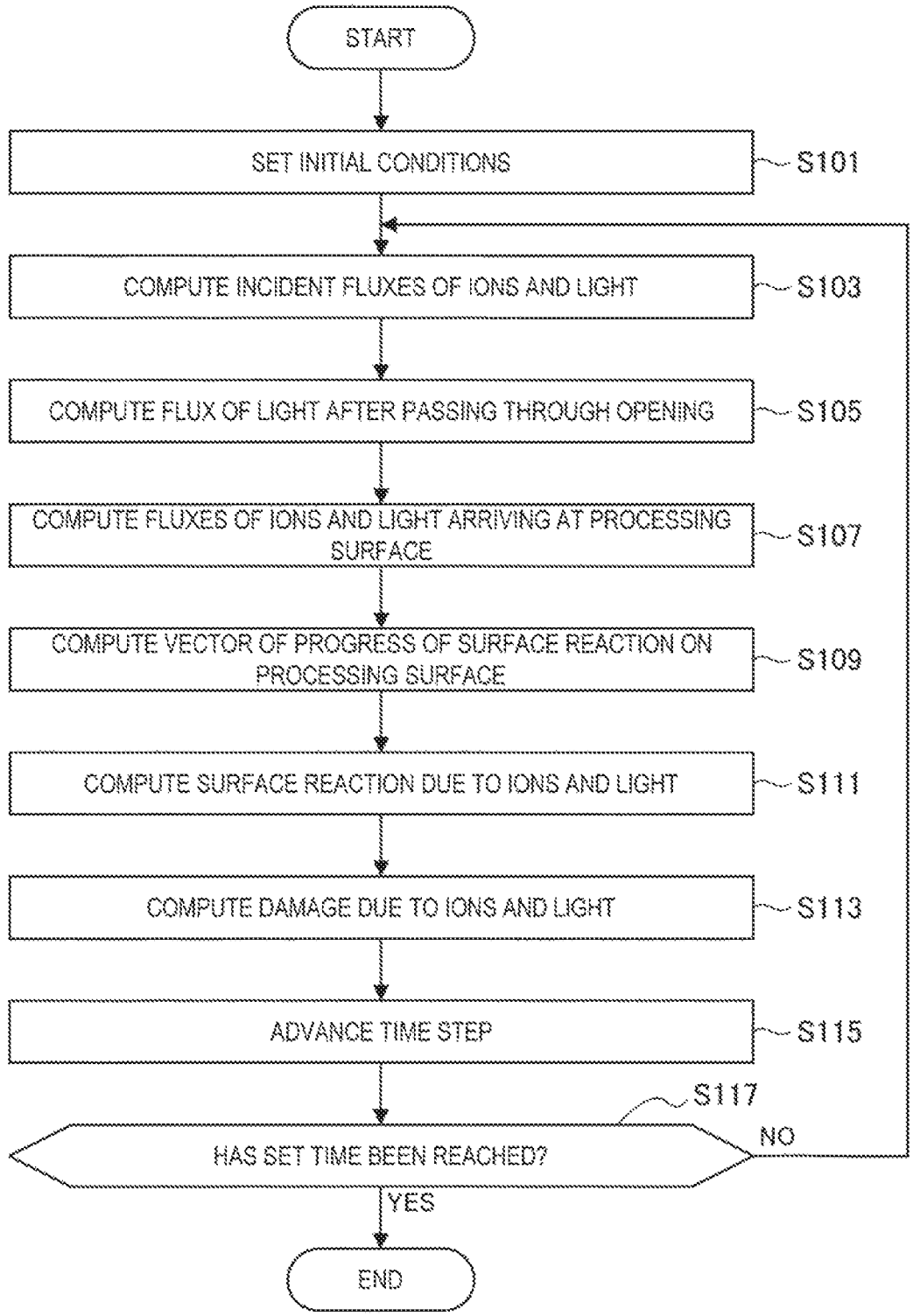
FIG. 2 is a flow chart describing a flow of a damage prediction method according to the embodiment.

Next, a flow of a damage prediction method according to the present embodiment is described with reference to FIG. 2. FIG. 2 is a flow chart describing a flow of a damage prediction method according to the present embodiment.

Note that, although in the following a voxel model using two-dimensional voxel as computational fragments is shown as an example of a computation technique, the technology according to the present disclosure is not limited to such an example. In the damage prediction method according to the present embodiment, also another known computation technique such as a level-set method or a string method may be used as the computation technique, for example.

As shown in FIG. 2, first, initial conditions of a processing process using plasma 1 are set (S101). The initial conditions of the processing process specifically include conditions regarding the processing process, conditions regarding a workpiece, etc. For example, the conditions regarding the processing process may include the kind of the processing process, conditions for the generation of plasma 1, conditions regarding the kind of gas for forming plasma 1, conditions regarding the projection of ions generated by plasma 1, etc. Further, the conditions regarding the workpiece 7 may include, for example, conditions regarding the surface form of the workpiece 7 (or conditions regarding the pattern of the mask 75), conditions regarding the material of the workpiece 7, etc.

Further, the initial conditions may include conditions regarding the prediction accuracy of the damage prediction method. The conditions regarding the prediction accuracy may include, for example, the size of a computational fragment, the approximation level at the time of computation, the interval of sampling, the time interval at which damage prediction is executed, etc.

Next, the incident fluxes of ions 3 and light 5 generated by plasma 1 are computed (S103). Specifically, the incident fluxes of ions 3 and light 5 generated by plasma 1 are computed on the basis of conditions for the generation of plasma 1, conditions regarding the kind of gas for forming plasma 1, etc. Note that the flux of ions 3 or light 5 refers to a flow of ions 3 or light 5 expressed in a vector field.

For example, the incident fluxes of ions 3 and light 5 generated by plasma 1 may be computed by simulation based on initial conditions, or may be computed using actual measurement values measured in a chamber in which a processing process is performed.

Figure 3:
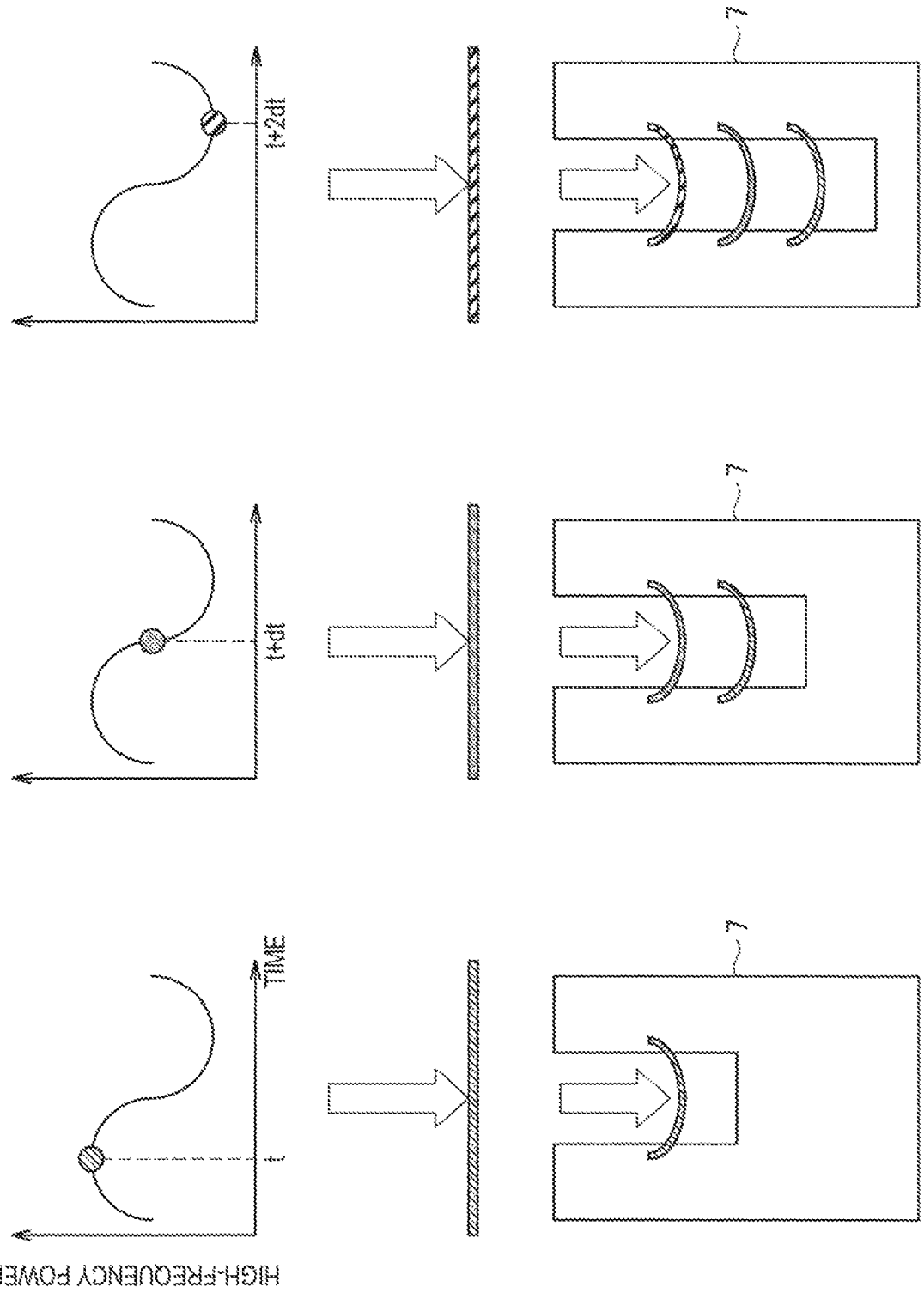
FIG. 3 is an explanatory diagram schematically showing incidence of light generated by plasma.

Here, the incident flux of light 5 generated by plasma 1 is described with reference to FIG. 3. FIG. 3 is an explanatory diagram schematically showing the incidence of light 5 generated by plasma 1.

In a chamber in which a processing process is performed, the region where plasma 1 is generated is apart from the surface of the workpiece 7 (that is, the surface of the mask 75) by a distance of approximately several centimeters. On the other hand, the size of a pattern of the surface of the workpiece 7 is approximately several micrometers. Therefore, the distance from plasma 1 to the workpiece 7 is sufficiently large relative to the size of the workpiece 7; thus, light 5 generated by plasma 1 can be regarded as a plane wave propagated from a sufficiently distant place to the workpiece 7.

Further, as shown in FIG. 3, in a case where, for example, the plasma 1 is high-frequency wave plasma, plasma 1 is generated by the application of high-frequency voltage, and hence beams of light 5 derived from plasma 1 are projected on the workpiece 7 one after another, as a plane wave of which the phase varies with time steps dt. Thus, the beams of light 5 projected on the workpiece 7 have mutually different phases, and hence the influence of interference between beams of light 5 projected on the workpiece 7 can be regarded as small. That is, light 5 that is projected on the workpiece 7 from plasma 1 can be approximated as a plane wave, and can be used for computation while influence by interference is neglected.

Note that, also in a case where the plasma 1 is plasma using an alternating current signal of a microwave or the like, similarly a plane wave of which the phase varies with time steps is projected on the workpiece 7, as light 5 derived from plasma 1. Thus, also in such a case, the influence of interference in the interior of a pattern of the workpiece 7 can be neglected in light 5 derived from plasma 1.

Subsequently, the flux of light 5 after it has passed through a pattern (that is, an opening) of the mask 75 of the surface of the workpiece 7 is computed (S105). Specifically, the flux of light 5 after it has passed through an opening of the mask 75 formed on the surface of the workpiece 7 is computed by a diffraction approximation based on the wavelength of light 5 and the size of the opening.

For example, the flux of light 5 after it has passed through the opening of the mask 75 may be computed using an approximation based on Fresnel diffraction. Fresnel diffraction is diffraction caused by light of a plane wave that has passed through an opening that is sufficiently small relative to the distance from the light source.

In the damage prediction method according to the present embodiment, as described above, light 5 generated from plasma 1 can be regarded as a plane wave, and the size of the opening of the mask 75 formed on the surface of the workpiece 7 is much smaller than the distance from plasma 1 to the workpiece 7. Therefore, light 5 projected on the workpiece 7 can be regarded as making Fresnel diffraction.

Figure 4:
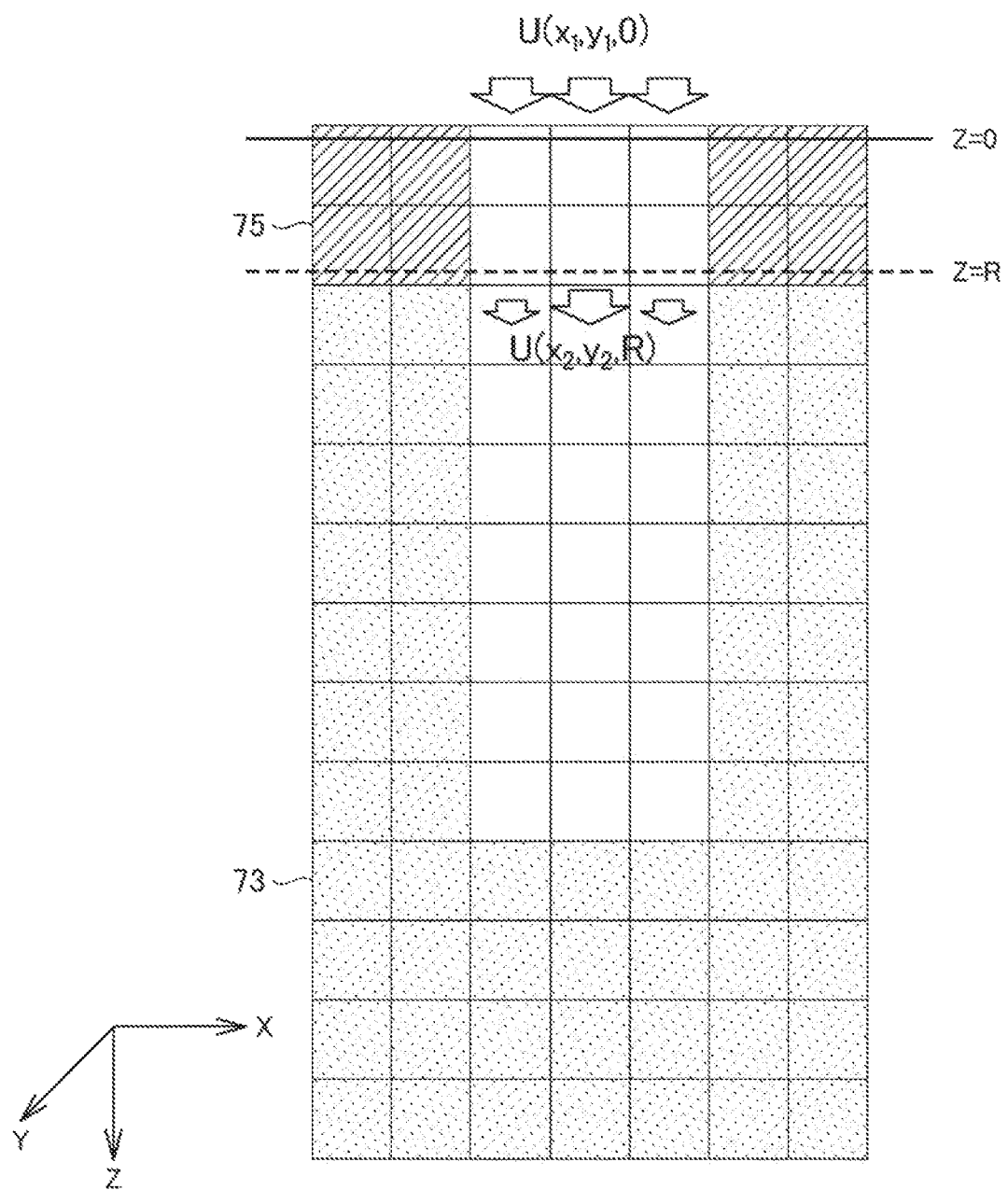
FIG. 4 is an explanatory diagram describing a method for computing a flux of light after it has passed through an opening of a mask.

Here, a technique for computing the flux (or the intensity distribution) of light 5 after it has passed through an opening of the mask 75, using Fresnel diffraction, is specifically described with reference to FIG. 4. FIG. 4 is an explanatory diagram describing a method for computing the flux of light 5 after it has passed through an opening of the mask 75. In FIG. 4, facing the drawing, the direction from the top to the bottom is taken as the positive direction of a Z-axis, the direction from the left to the right is taken as the positive direction of an X-axis, and the direction from the far side to the near side of the drawing sheet is taken as the positive direction of a Y-axis.

As shown in FIG. 4, first, the Z-coordinate immediately before light passes through an opening of the mask 75 is set to Z=0, and the flux of light 5 (that is, the intensity distribution of light generated by plasma) before it passes through the opening of the mask 75 is expressed as $U(x_1, y_1, 0)$. In this event, if the wavelength of light 5 is denoted by $\lambda$ and the wave number of light 5 is denoted by k, the flux $U(x_2, y_2, z)$ of light 5 immediately after it has passed through the opening of the mask 75 can be expressed as Mathematical Formula 1 below by superposition of plane waves. Note that $\Sigma$ represents the opening region at Z=0 of FIG. 4.

[Math. 1]

$$U(x_2, y_2, z) = \frac{i}{\lambda} \int \int_{\Sigma} U(x_1, y_1, 0) \frac{e^{-ikr}}{r} \cos\gamma \, dx_1 dy_1 \quad \text{(Mathematical Formula 1)}$$

In a case where the shape of the opening of the mask 75 is not a shape in which the size of the opening on the processing film 73 side is smaller (what is called an inverse tapered shape), $\cos(\gamma)$ can be approximated as 1. Further, in a case where the flux at a Z-coordinate of R immediately after light 5 has passed through the opening of the mask 75 is computed, 1/r can be approximated as 1/R. By the above approximations, Mathematical Formula 1 can be expressed as Mathematical Formula 2 below.

[Math. 2]

$$U(x_2, y_2, R) \sim \frac{i}{\lambda R} \int \int_{\Sigma} U(x_1, y_1, 0) e^{-ikr} dx_1 dy_1 \quad \text{(Mathematical Formula 2)}$$

Further, by approximating light 5 as making Fresnel diffraction at the opening of the mask 75, the $R^2$ term and the subsequent terms of the distance r are neglected. Therefore, the distance r can be expressed as Mathematical Formula 3 below.

[Math. 3]

$$r = \sqrt{R^2 + (x_2 - x_1)^2 + (y_2 - y_1)^2} \sim R + \frac{(x_2 - x_1)^2 + (y_2 - y_1)^2}{2R} + \ldots \quad \text{(Mathematical Formula 3)}$$

Hence, by substituting Mathematical Formula 3 in Mathematical Formula 2, Mathematical Formula 2 can be expressed as Mathematical Formula 4 below.

[Math. 4]

$$U(x_2, y_2, R) = \quad \text{(Mathematical Formula 4)}$$
$$\frac{i}{\lambda R} e^{-ikR} \int\int_{\Sigma} U(x_1, y_1, 0) \exp\left[-ik\frac{(x_2-x_1)^2}{2R}\right]$$
$$\exp\left[-ik\frac{(y_2-y_1)^2}{2R}\right] dx_1 dy_1$$

Here, if the integral term of the right-hand side of Mathematical Formula 4 is replaced by Mathematical Formula 5 and Mathematical Formula 6 below, Mathematical Formula 4 can be expressed as Mathematical Formula 7 below. Hence, the right-hand side of Mathematical Formula 7 is the amplitude of the flux of light 5 at Z=R.

[Math. 5]

$$C_1 = \quad \text{(Mathematical Formula 5)}$$
$$\int\int_{\Sigma} \cos\left(k\frac{(x_2-x_1)^2 + (y_2-y_1)^2}{2R}\right) dx_1 dy_1$$

$$C_2 = \int\int_{\Sigma} \sin\left(k\frac{(x_2-x_1)^2 + (y_2-y_1)^2}{2R}\right) dx_1 dy_1 \quad \text{(Mathematical Formula 6)}$$

$$U(x_2, y_2, R) = \frac{iU_0}{\lambda R} e^{-ikR}[C_1 - iC_2] \quad \text{(Mathematical Formula 7)}$$

Therefore, in a case where $U(x_1, y_1, 0)$ is expressed as $U_0$, the intensity distribution of light 5 at Z=R can be expressed as Mathematical Formula 8 below by the product of $U(x_2, y_2, R)$ and the conjugate complex number of $U(x_2, y_2, R)$. That is, $F_2$ is the intensity distribution of light 5 at coordinates of $(x_2, y_2, R)$.

[Math. 6]

$$F_2(x_2, y_2, R) = U(x_2, y_2, R)U(x_2, y_2, R)\dagger \quad \text{(Mathematical Formula 8)}$$
$$= \frac{U_0^2}{\lambda^2 R^2}(C_1^2 + C_2^2)$$

Note that the flux $G_2(x_2, y_2, R)$ of ions 3 after they have passed through an opening of the mask 75 may be computed by, for example, searching a database in which the energy and the angle of incidence of ions 3 emitted from plasma 1, and the flux $G_2(x_2, y_2, R)$ of ions 3 are associated together. Further, the flux $G_2(x_2, y_2, R)$ of ions 3 may be computed by sheath simulation, or may be computed by using actual measurement values measured in a chamber in which a processing process is performed, for example. Unlike light 5, ions 3 have negligibly small influence of wave nature; thus, the change of the flux between before and after ions 3 pass through the opening of the mask 75 can be neglected.

Next, the fluxes of ions 3 and light 5 arriving at the processing surface of the processing film 73 are computed (S107). Specifically, the fluxes of ions 3 and light 5 arriving at the processing surface are computed by ray-tracing the fluxes of ions 3 and light 5 in units of angles of incidence on the processing surface and taking into account the reflection of ions 3 and light 5 in the interior of the pattern of the processing film 73. For example, the fluxes of ions 3 and light 5 arriving at the processing surface may be computed by performing, on the fluxes of ions 3 and light 5 after they have passed through the opening of the mask 75, an operation with the number of times of reflection and the reflection probability of ions 3 and light 5.

Figure 5:
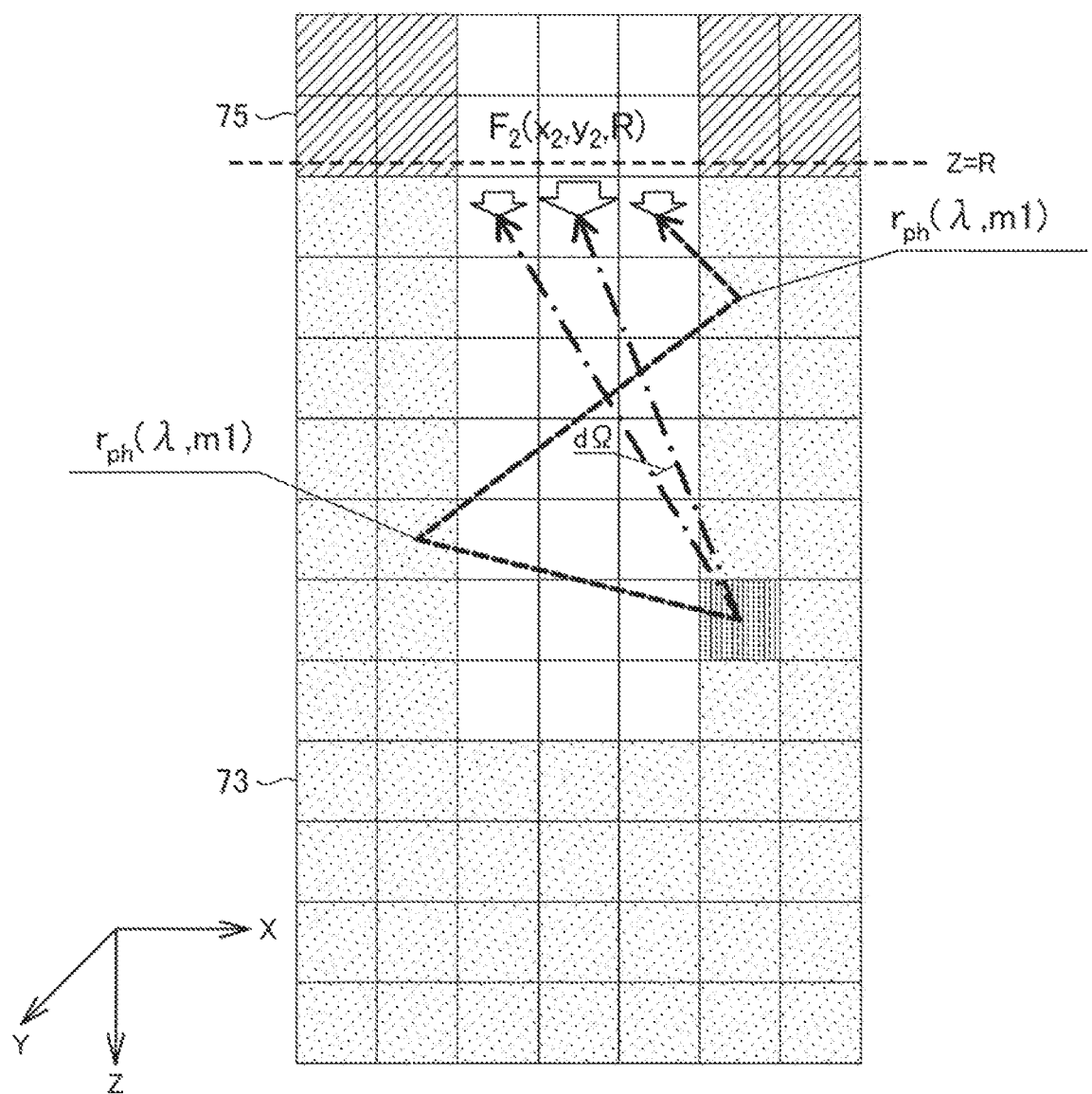
FIG. 5 is an explanatory diagram describing a technique for computing a flux of light arriving at a processing surface of a processing film.
Figure 6:
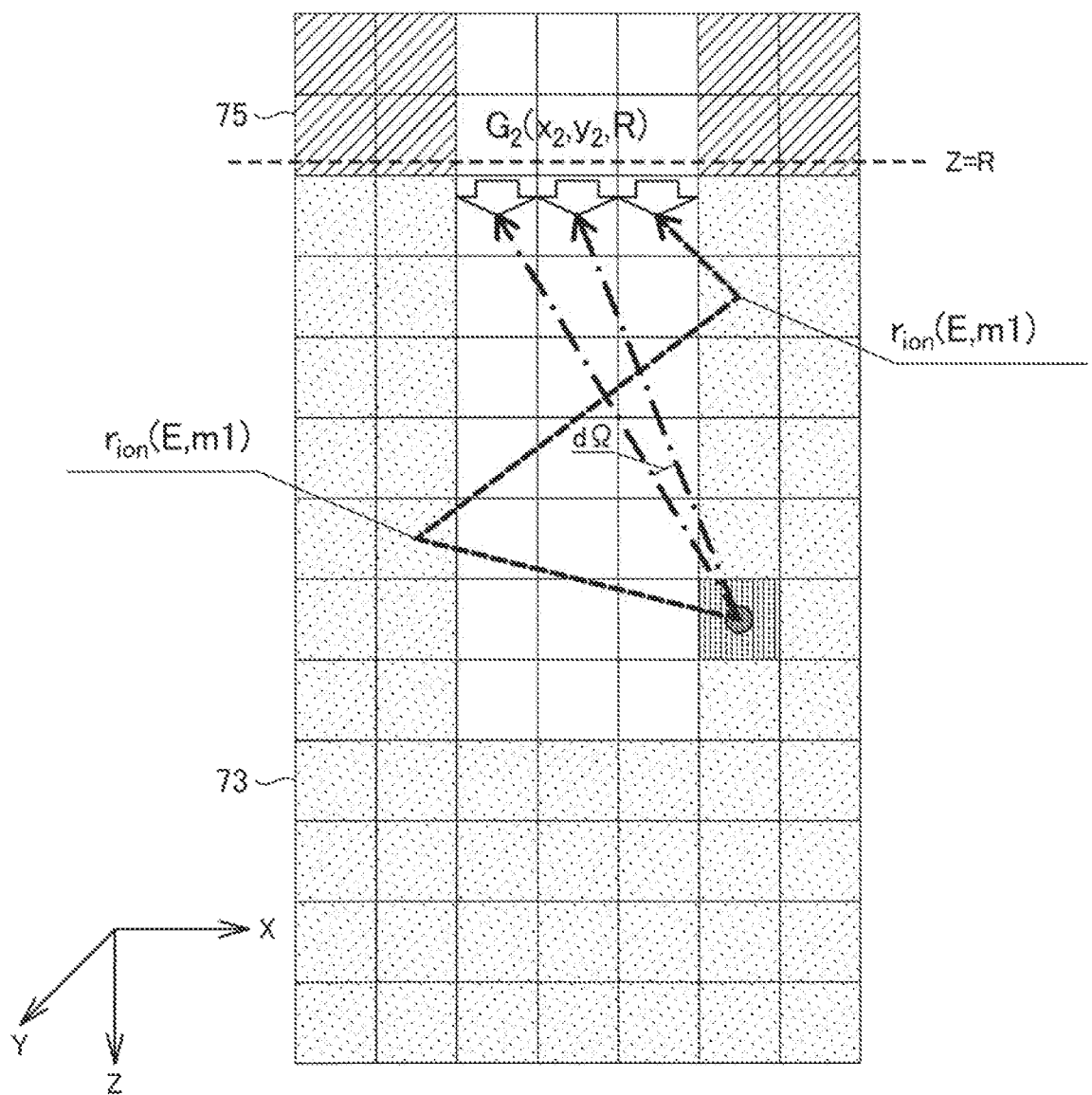
FIG. 6 is an explanatory diagram describing a technique for computing a flux of ions arriving at a processing surface of a processing film.

Here, techniques for computing the fluxes of ions 3 and light 5 arriving at the processing surface of the processing film 73 are specifically described with reference to FIG. 5 and FIG. 6. FIG. 5 is an explanatory diagram describing a technique for computing the flux of light 5 arriving at the processing surface of the processing film 73, and FIG. 6 is an explanatory diagram describing a technique for computing the flux of ions 3 arriving at the processing surface of the processing film 73.

As shown in FIG. 5, the flux of light 5 arriving at the surface of the processing film 73 can be derived by performing ray tracing in units of angle steps $d\Omega$ in the opening direction of the mask 75 and the processing film 73, with a voxel that is a computation object as a starting point. Note that the angle step $d\Omega$ is set in the initial conditions, for example.

Specifically, the ray tracing of light 5 incident on the processing surface is performed in units of angle steps $d\Omega$ of the angle of incidence; and it is assumed that, in a case where light 5 strikes the side wall or the like of the processing film 73, light 5 is reflected with a reflection probability of $r_{ph}$ (provided that $0<r_{ph}<1$) according to the wavelength $\lambda$ of light 5 and the film kind mi of the processing film 73. This is repeated until the Z-coordinate of light 5 reaches Z=R. For example, in a case where it is determined that reflection is made n times until the Z-coordinate of light 5 reaches Z=R, the flux $F_2'$ of light 5 arriving at the surface of the processing film 73 can be expressed by Mathematical Formula 9 below, using the flux $F_2$ of light 5 that has passed through the opening of the mask 75. That is, it can be considered that light 5 expressed by the flux $F_2'$ has arrived at the voxel that is the computation object.

[Math. 7]

$$F_2' = F_2(x_2, y_2, R) \times \prod_n r_{ph}(\lambda, mi) \quad \text{(Mathematical Formula 9)}$$

Further, as shown in FIG. 6, the flux of ions 3 arriving at the surface of the processing film 73 can be derived by performing ray tracing in units of angle steps $d\Omega$ in the opening direction of the mask 75 and the processing film 73, with a voxel that is a computation object as a starting point.

Specifically, the ray tracing of ions 3 incident on the processing surface is performed in units of angle steps $d\Omega$ of the angle of incidence; and it is assumed that, in a case where ions 3 strike the side wall or the like of the processing film 73, ions 3 are reflected with a reflection probability of $r_{ion}$ (provided that $0<r_{ion}<1$) according to the energy E of ions 3 and the film kind mi of the processing film 73. This is repeated until the Z-coordinate of ions 3 reaches Z=R. For example, in a case where it is determined that reflection is made n times until the Z-coordinate of ions 3 reaches Z=R, the flux $G_2'$ of ions 3 arriving at the surface of the processing film 73 can be expressed by Mathematical Formula 10 below, using the flux $G_2$ of ions 3 that have passed through the opening of the mask 75. That is, it can be considered that ions 3 expressed by the flux $G_2'$ have arrived at the voxel that is the computation object.

[Math. 8]

$$G'_2 = G_2(x_2, y_2, R) \times \prod_n r_{ion}(\lambda, mi)$$ (Mathematical Formula 10)

Note that the angle step dΩ used for the ray tracing of ions 3 is set in the initial conditions, for example. The angle step dΩ used for the ray tracing of ions 3 may be the same as or different from the angle step dΩ used for the ray tracing of light 5. However, in a case where the angle steps dΩ used for the ray tracing of ions 3 and light 5 are the same, the pieces of ray tracing of ions 3 and light 5 can be performed simultaneously, and hence the computational complexity can be reduced.

Here, the flux $G_2$ of ions 3 that have passed through an opening of the mask 75 may be computed by, as described above, searching a database in which the energy and the angle of incidence of ions 3 emitted from plasma 1, and the flux of ions 3 are associated together. Further, the flux $G_2$ of ions 3 may be computed by sheath simulation, or may be computed by using actual measurement values measured in a chamber in which a processing process is performed.

Subsequently, the vector of the progress of reaction on the processing surface of the processing film 73 is computed (S109). Specifically, the vectors of damage to the processing film 73 due to ions 3 and light 5 and the vector of the shape advance of the processing film 73 due to ions 3 etc. are computed on the processing surface of the processing film 73.

As the vector of the progress of reaction on the processing surface of the processing film 73, for example, a normal vector in which the vectors of fluxes of ions 3 incident on the processing surface of the processing film 73 are added together may be used.

Figure 7:
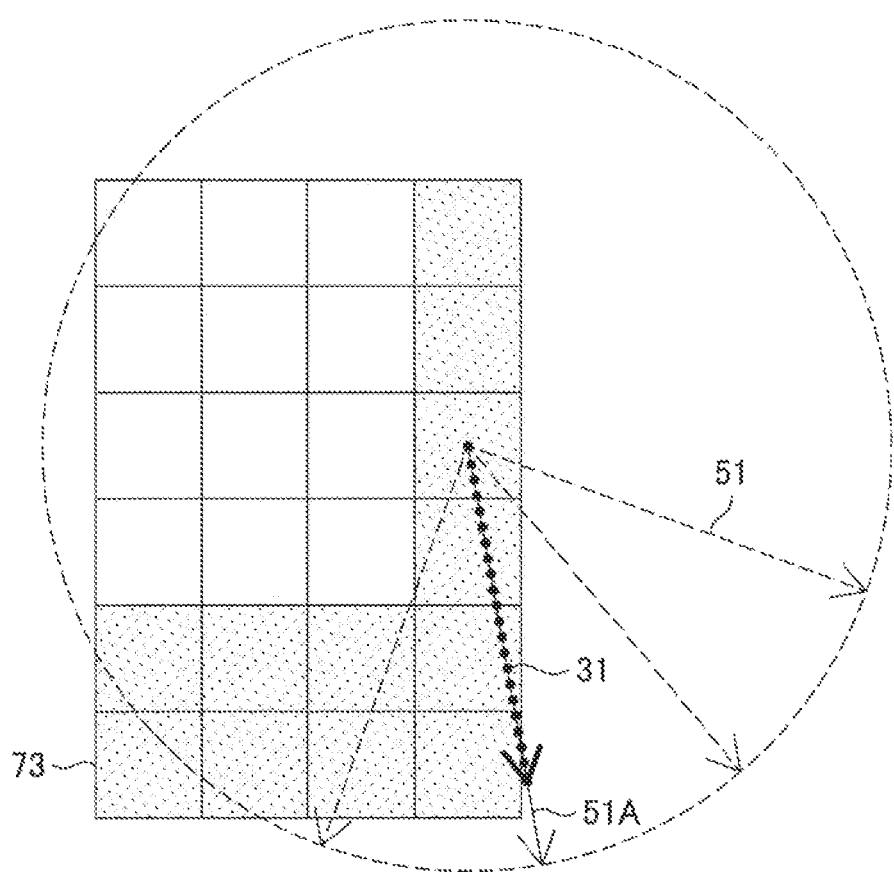
FIG. 7 is an explanatory diagram showing fluxes of ions and light arriving at a processing surface of a processing film.

The point described above will now be described with reference to FIG. 7. FIG. 7 is an explanatory diagram showing fluxes of ions 3 and light 5 arriving at the processing surface of the processing film 73. As shown in FIG. 7, ions 3 are incident on the processing surface of the processing film 73 while having directivity. Therefore, the direction 31 of reaction progress due to ions 3 incident on a voxel is a normal vector in which the vectors of fluxes of ions 3 that have arrived at the voxel are added together.

On the other hand, light 5 is incident on the processing surface of the processing film 73 isotropically. Therefore, the wave front of propagation light 51 of light 5 incident on a voxel spreads concentrically, with the voxel as the center, and does not have directivity. Thus, for a vector 51A used when predicting damage due to light 5, a normal vector of fluxes of ions 3 is used as a representative. In such a case, damage due to light 5 and damage due to ions 3 can be computed simultaneously, and therefore the computational complexity can be reduced.

Next, surface reaction on the processing film 73 due to ions 3 and light 5 is computed (S111). The surface reaction refers to, for example, film formation, etching, ashing, cleaning, etc. with ions 3 incident on the processing surface. In a case where the surface reaction is film formation, the processing film 73 grows by the surface reaction, and thus a new voxel is generated in a two-dimensional voxel model. Further, in a case where the surface reaction is etching or ashing, the processing film 73 is removed by the surface reaction, and thus a voxel of the processing surface of the processing film 73 disappears in a two-dimensional voxel model.

Such surface reaction on the processing film 73 may be computed by, for example, using a known simulation technique in accordance with the plasma process. Further, the vector of the progress of surface reaction on the processing film 73 may be the vector of the progress of surface reaction computed in S109 of the previous stage, for example.

Subsequently, damage to the processing film 73 due to ions 3 and light 5 is computed (S113). Specifically, damage to the processing film 73 due to ions 3 and light 5 is computed by different models in accordance with the entry lengths of ions 3 and light 5 from the processing surface of the processing film 73. Further, the direction of damage to the processing film 73 due to ions 3 and light 5 is assumed to be the direction of the vector of the progress of surface reaction computed in S109.

The entry lengths of ions 3 and light 5 to the processing film 73 vary with the kind of gas that is the ion source and the material of the processing film 73, and light 5 enters the processing film 73 deeper than ions 3 do. Further, light 5 not only by itself gives damage to the processing film 73, but also increases damage that ions 3 give to the processing film 73, by increasing the probability of reaction between ions 3 and the processing film 73. Hence, damage to the processing film 73 due to ions 3 and light 5 is computed by using different models for an entry length with which both ions 3 and light 5 enter and an entry length with which only light 5 enters, in order to take into account the interaction between ions 3 and light 5.

Figure 8:
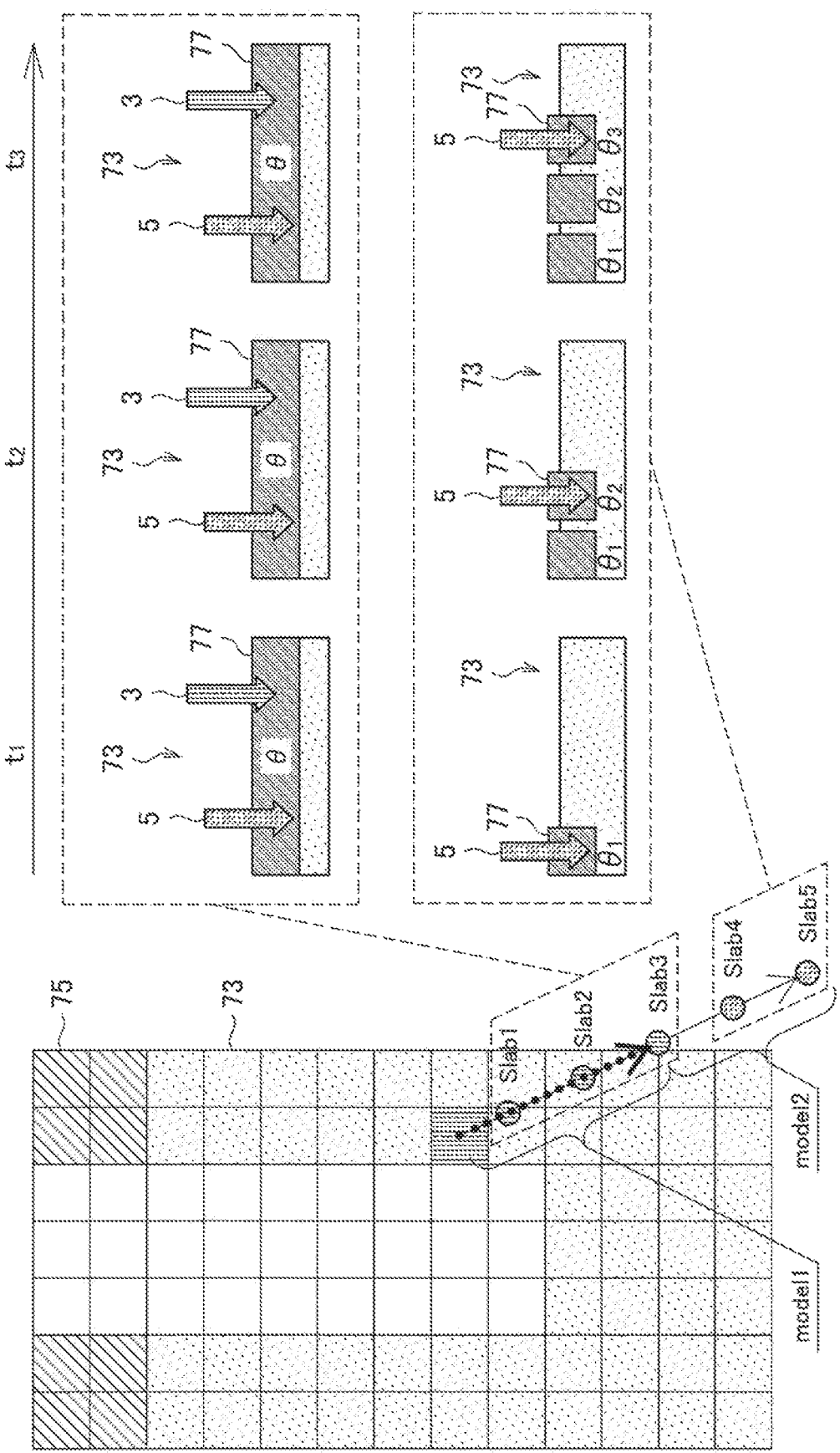
FIG. 8 is an explanatory diagram schematically showing damage to a processing film due to ions and light.

Here, a technique for computing damage to the processing film 73 due to ions 3 and light 5 is described more specifically with reference to FIG. 8. FIG. 8 is an explanatory diagram schematically showing damage to the processing film 73 due to ions 3 and light 5.

As shown in FIG. 8, damage to the processing film 73 due to ions 3 and light 5 is calculated by dividing a voxel on which ions 3 and light 5 are incident into a plurality of thin pieces (in FIG. 8, Slabs 1 to 5) in accordance with the distance from the processing surface, and computing damage for each divided Slab.

Specifically, in Slabs in which both ions 3 and light 5 enter (Slabs 1 to 3), damage to the processing film 73 is computed with a model in which interaction between ions 3 and light 5 is taken into account (model 1). Further, in Slabs in which only light 5 enters (Slabs 4 to 5), damage to the processing film 73 is computed with a model in which damage generation due to light 5 is reflected (model 2). Note that the entry lengths of ions 3 and light 5 to the processing film 73 are computed on the basis of the kind of gas that is the ion source and the material of the processing film 73.

In the following, a model of damage to the processing film 73 in a region where both ions 3 and light 5 enter (model 1) and a model of damage to the processing film 73 in a region where only light 5 enters (model 2) are described while an etching process is taken as an example.

First, a model of damage to the processing film 73 in a region where both ions 3 and light 5 enter (model 1) is described. In a region where both ions 3 and light 5 enter, in addition to the generation of a damage proportion θ due to the incidence of ions 3 and light 5, the disappearance of θ due to etching has occurred. Hence, the generation and disappearance of θ in the j-th Slab can be expressed by Mathematical Formula 11 below. Further, it can be considered that the generation and disappearance of the damage proportion θ are in equilibrium with respect to the shape change of the processing film 73, and thus it can be considered that a damage region 77 is formed at a fixed rate in the processing film 73 at each time ($t_1$, $t_2$, or $t_3$).

[Math. 9]

$$\sigma \frac{d\theta(j)}{dt} = [1 - \theta(j)]\left[\sum_i Y_i(V_{net})\Gamma_i + \sum_\lambda Y_{ph}(\lambda)\Gamma_{ph}\right] - \theta(j)\Gamma_{DB}^{ER}$$ (Mathematical Formula 11)

In Mathematical Formula 11, the first term and the second term of the right-hand side show the generation of damage due to ions 3 and light 5, respectively, and the third term of the right-hand side shows the disappearance of damage due to etching. $Y_i(V_{net})$ represents the probability of reaction between ions 3 and the processing film 73 depending on the energy $V_{net}$ in the processing film 73 of ions 3, and $Y_{ph}(\lambda)$ represents the probability of reaction between light 5 and the processing film 73 depending on the wavelength λ of light 5. Further, σ represents the surface density of the processing film 73.

Further, $\Gamma_{DB}$ represents the amount of etching in the processing film 73. Further, $\Gamma_i$ represents the flux of ions 3 incident on each Slab, and $\Gamma_{ph}$ represents the flux of light 5 incident on each Slab. Note that, for $\Gamma_{DB}$, the result of computation of surface reaction on the processing film 73 due to ions 3 and light 5 calculated in S111 of the previous stage may be used.

Further, as the flux of light 5 propagates through the film of the processing film 73 further, the flux of light 5 attenuates in accordance with the extinction coefficient α(λ, mi) depending on the film kind mi of the processing film 73 and the wavelength λ of light 5, and with the depth d from the processing surface. Therefore, the flux $\Gamma_{ph}$ of light 5 incident on each Slab can be expressed by Mathematical Formula 12 below, using the flux $F_2'$ of light 5 that has arrived at the processing surface. On the other hand, as the flux of ions 3 propagates through the film of the processing film 73 further, the flux of ions 3 attenuates in accordance with the extinction coefficient α'(E, mi) depending on the film kind mi of the processing film 73 and the energy E of ions 3, and with the depth d from the processing surface. Therefore, the flux $\Gamma_i$ of ions 3 incident on each Slab can be expressed by Mathematical Formula 13 below, using the flux $G_2'$ of ions 3 that have arrived at the processing surface.

[Math. 10]

$$\Gamma_{ph} = F_2' \times \exp(-\alpha d)$$ (Mathematical Formula 12)

$$\Gamma_i = G_2' \times \exp(-\alpha' d)$$ (Mathematical Formula 13)

Here, in a case where the time scale of the generation and disappearance of θ is sufficiently small relative to the time scale dt of the shape change of the processing film 73, it can be considered that the generation and disappear of θ is in equilibrium, as described above. Thus, by making the approximation of dθ/dt=0, the damage proportion θ and damage Da in the j-th Slab can be expressed by Mathematical Formulae 14 and 15 below. Note that L(j) represents the thickness of the j-th Slab, and A' is a parameter of the simulation.

[Math. 11]

$$\theta(j) = \frac{\left[\sum_i Y_{iSiN}(V_{net})\Gamma_i + \sum_\lambda Y_{ph}(\lambda)\Gamma_{ph}\right]}{\left[\sum_i Y_{iSiN}(V_{net})\Gamma_i + \sum_\lambda Y_{ph}(\lambda)\Gamma_{ph}\right] + \Gamma_{DB}^{ER}}$$ (Mathematical Formula 14)

$$D_a(j) = L(j) \times \theta(j) \times A'$$ (Mathematical Formula 15)

Next, a model of damage to the processing film 73 in a region where only light 5 enters (model 2) is described. That is, in a region deeper than depths at which ions 3 enter, only light 5 enters, and hence it is sufficient that only the generation of damage to the processing film 73 due to light 5 be considered. It can be considered that light 5 newly gives damage to a region of the processing film 73 where damage is not received at a time $t_n$ and forms a damage region 77. Further, it can be considered that damage regions 77 formed by light 5 are accumulated in the processing film 73 and saturate at a certain level (the situation reaches θ=1). Therefore, the rate of generation of θ in the j-th Slab can be expressed by Mathematical Formula 16 below. Further, the term of Σ of the right-hand side of Mathematical Formula 16 does not depend on time t, and can be regarded as a constant β; therefore, θ can also be expressed as Mathematical Formula 17.

[Math. 12]

$$\sigma \frac{d\theta}{dt} = [1 - \theta]\left[\sum_\lambda Y_{ph}(\lambda)\Gamma_{ph}\right]$$ (Mathematical Formula 16)

$$\theta = 1 - \exp(-\beta t)$$ (Mathematical Formula 17)

Therefore, damage Da due to light 5 generated in the j-th Slab at a time $t_n$ can be expressed as Mathematical Formula 18. Note that $dL_{UV}$ represents the thickness of the j-th Slab, and A is a parameter of the simulation.

[Math. 13]

$$D_a(j, t_n) = \left[1 - \sum_{t'=0}^{t_n-1} \theta(j, t')\right] \times \theta(j, t_n) \times dL_{UV} \times A$$ (Mathematical Formula 18)

By performing the above computation in each voxel of the processing surface of the processing film 73 in units of time steps, the propagation of ions 3 and light 5 to the processing film 73 and damage to the processing film 73 due to ions 3 and light 5 can be computed. In this method, damage to the processing film 73 is computed while different models are used for a region where both ions 3 and light 5 enter and a region where only light 5 enters, and thus the damage distribution in the processing film 73 can be computed more accurately.

Next, the time elapsed from the start of the plasma process is caused to advance by an amount of a time step (S115), and it is determined whether the elapsed time has reached a set time or not (S117). The set time corresponds to the time of the end of the plasma process, and the time step corresponds to the time interval at which the damage distribution of the processing film 73 is computed. The set time and the time step may be set at the time of the setting of the initial conditions, for example.

In a case where the elapsed time has not reached the set time (S117/No), the processing returns to S103 and the computation is continued in order to compute the damage distribution of the processing film 73 in the next time step. On the other hand, in a case where the elapsed time has reached the set time (S117/Yes), the damage prediction is ended.

Note that, although in the above a flow of predicting damage that ions 3 and light 5 generated by plasma 1 give to the processing film 73 is described, it goes without saying that the damage of, in addition to the processing film 73, other films below the processing film 73, the substrate 71, etc. can be predicted similarly.

By the flow described above, in the damage prediction method according to the present embodiment, the flux of light 5 is used, and thereby light 5 is treated as a wave and diffraction at an opening of the mask 75 can be taken into account. Further, in the damage prediction method according to the present embodiment, damage to the processing film 73 is computed by using different models for a region where both ions 3 and light 5 enter and a region where only light 5 enters; thus, damage can be predicted while interaction between ions 3 and light 5 is taken into account. Therefore, in the damage prediction method according to the present embodiment, the damage distribution of the processing film 73 can be computed more accurately.

Further, in the damage prediction method according to the present embodiment, fluxes are used, and thereby pieces of damage to the processing film 73 due to ions 3 and light 5 can be computed by a common configuration; therefore, the computation speed can be improved. Thus, in the damage prediction method according to the present embodiment, the damage distribution of the processing film 73 can be computed within a practical time.

(1.3. Specific Examples)

Next, a first to a third specific example of the damage prediction method according to the present embodiment are described with reference to FIG. 9 to FIG. 15.

(First Specific Example)

First, a first specific example in which damage due to etching is predicted is described with reference to FIG. 9 to FIG. 11. The first specific example is an example in which the fluxes of ions and light incident on an opening of a resist is computed by plasma simulation.

Figure 9:
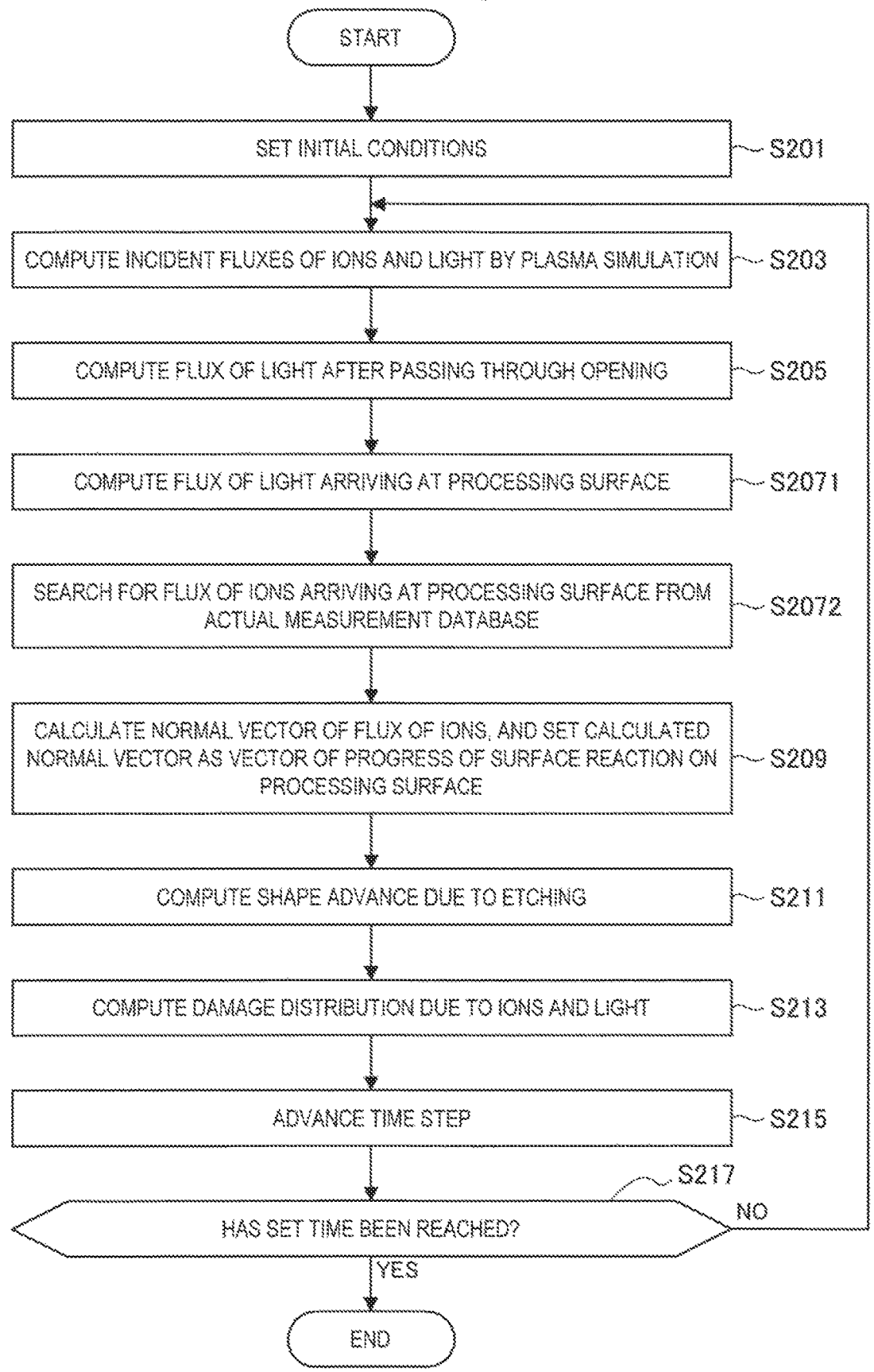
FIG. 9 is a flow chart describing a flow of a damage prediction method in a first specific example.

FIG. 9 is a flow chart describing a flow of a damage prediction method in the first specific example. Further, FIG. 10 is a block diagram showing the configuration of a database for searching for the flux of ions arriving at a processing surface of a workpiece. Further, FIG. 11 is a cross-sectional diagram schematically showing a workpiece serving as a processing object and a result of prediction of damage distribution.

As shown in FIG. 9, first, initial conditions are set (S201). In the first specific example, the following conditions were set as initial conditions.

Figure 11:
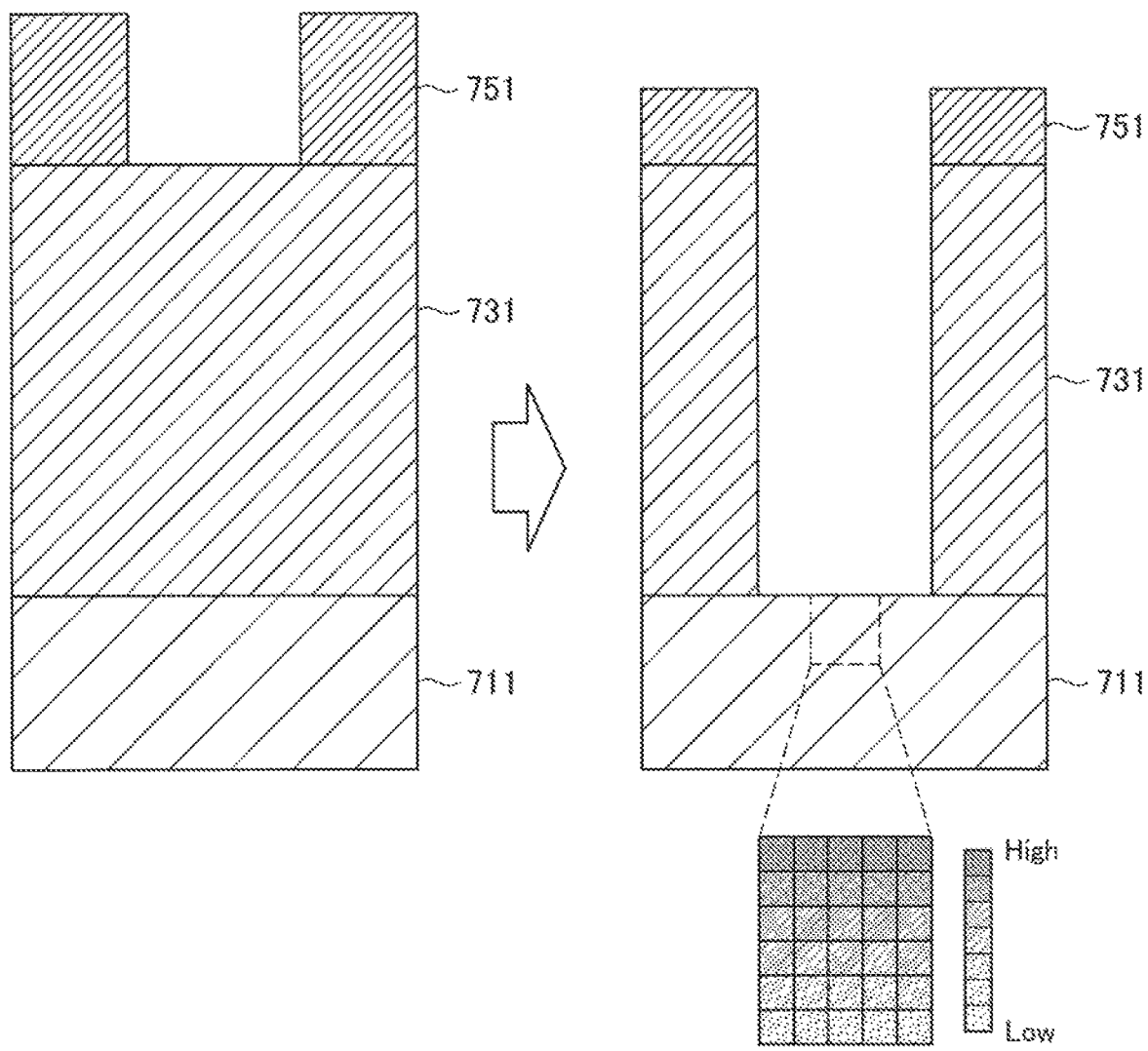
FIG. 11 is a cross-sectional diagram schematically showing a workpiece serving as a processing object and a result of prediction of damage distribution in the specific example.

For example, as shown in FIG. 11, a Si substrate 711 on which a SiO$_2$ layer 731 with a thickness of 1 µm and a resist layer 751 with a thickness of 400 nm were stacked was set as a workpiece serving as a processing object. Note that it is assumed that holes each having a diameter of 200 nm are patterned in the resist layer 751. That is, the first specific example is an example in which etching damage to the Si substrate 711 when patterning the SiO$_2$ layer 731 using the resist layer 751 as a mask is computed.

Further, process conditions and apparatus conditions were set as follows. The etching apparatus was of a capacitively coupled plasma (CCP) type, and the frequency of the applied voltage was set to 0.8 MHz for electrodes for ion drawing-in and to 27 MHz for electrodes for plasma generation. Note that the mechanism for plasma generation may be another mechanism such as an inductively coupled plasma (ICP) type or an electron cyclotron resonance (ECR) type.

The etching gas was a mixed gas of $C_4F_8$, $O_2$, and Ar, and the ratio between the flow rates was set to $C_4F_8:O_2:Ar=11:8:400$ (sccm). Note that sccm indicates the flow rate per minute (cm$^3$/min) of gas at 0° C. and 1 atmosphere; in a case where the flow rate is shown in the SI unit system, it is $C_4F_8:O_2:Ar=18.59\times10^{-4}:13.52\times10^{-4}:676\times10^{-4}$ (Pa·m$^3$/sec). The pressure of the interior of a chamber in which the workpiece was processed was set to 30 mTorr (4 Pa), and the etching time was set to 30 seconds. Further, the energy of ions generated by plasma was set to 0 V to 1450 V.

Further, the shape change of the SiO$_2$ layer 731 was modeled with a two-dimensional voxel model in which a square with a length of one side of 5 nm was taken as 1 voxel, for example. However, the shape change of the SiO$_2$ layer 731 may be modeled with another model, and may be modeled using a level-set method, a string method, or the like.

Next, the incident fluxes of ions and light (specifically, ultraviolet rays) generated by plasma are computed by plasma simulation (S203). For example, the fluxes of ions and light incident on the workpiece can be computed by using a computation method disclosed in Kuboi et al., Japanese Journal of Applied Physics, 49, 08JD01 (2010), JP 2013-115354A, or the like, while taking into account also the state of the wall surface of the chamber in which the workpiece is processed. Note that the wavelength region of the flux of light was set to 250 nm to 270 nm, which is the light emitting region of $CF_2$ gas, an etchant.

Subsequently, the flux of light after it has passed through an opening of the resist layer 751 is computed (S205). For example, the flux $F_2$ of light after it has passed through the opening of the resist layer 751 can be computed by using the approximation based on Fresnel diffraction described above, with the size of the opening of the resist layer 751 set to a circular shape with a diameter of 200 nm.

Further, ray tracing using the flux $F_2$ of light that has passed through the opening of the resist layer 751 is performed, and thereby the flux of light arriving at the processing surface of the SiO$_2$ layer 731 is computed (S2071). For example, the angle step $d\Omega$ with which ray tracing is performed is set to 1.5 degrees, reflection at the SiO$_2$ layer 731 is assumed to be mirror reflection, and the reflection probability is set to 0.1 for simplification, and the computation described above is performed; thereby, the flux $F_2'$ of light arriving at the processing surface of the SiO$_2$ layer 731 can be computed.

Subsequently, the flux of ions arriving at the processing surface of the SiO$_2$ layer 731 is computed by searching an actual measurement database (S2072).

Specifically, first, ray tracing is performed from the processing surface of the SiO$_2$ layer 731 similarly to S2071, and thereby the angle of incidence of ions after they have passed through the opening of the resist layer 751 is computed. Next, an actual measurement database is searched using, as arguments, the computed angle of incidence and the energy of ions, and thereby the flux $G_2$ of ions after they have passed through the opening of the resist layer 751 is derived. Subsequently, the derived flux $G_2$ of ions is subjected to an operation with the number of times of reflection derived by ray tracing and the reflection probability; thereby, the flux $G_2'$ of ions arriving at the processing surface of the $SiO_2$ layer 731 can be computed. Note that the angle step $d\Omega$ with which ray tracing is performed may be set to, for example, 1.5 degrees, and reflection at the $SiO_2$ layer 731 may be assumed to be mirror reflection with a reflection probability of 0.1.

Here, the configuration of an actual measurement database is described with reference to FIG. 10.

Figure 10:
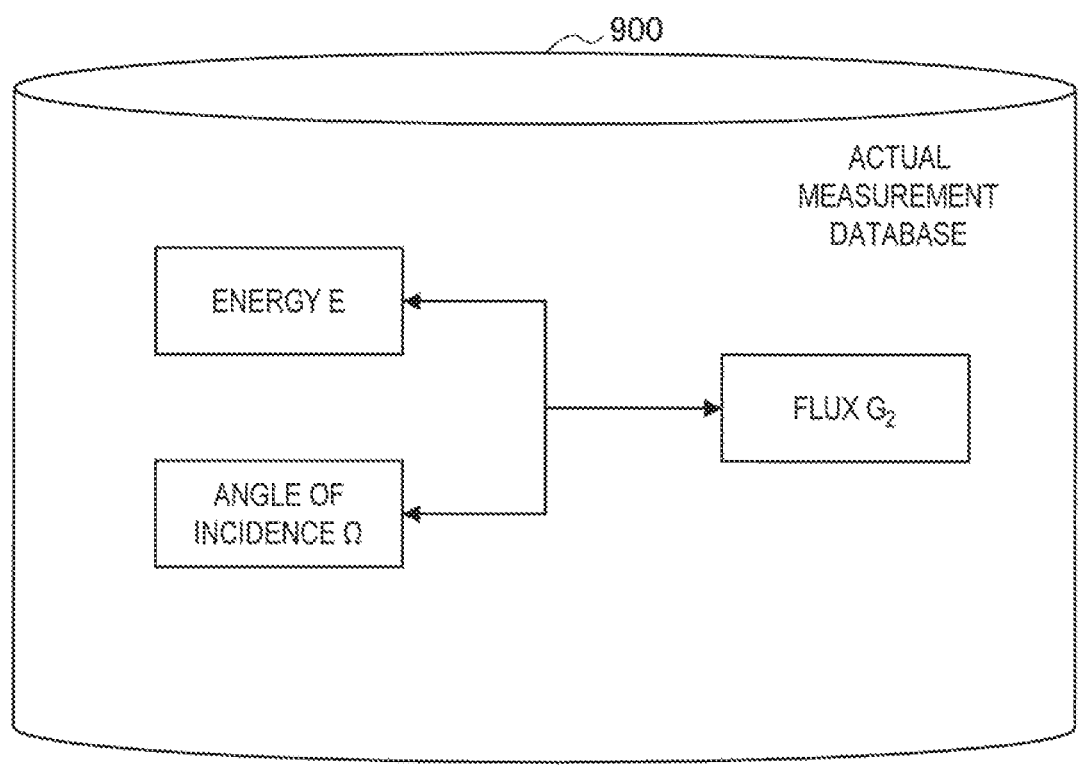
FIG. 10 is a block diagram showing a configuration of a database for searching for a flux of ions arriving at a processing surface of a workpiece.

As shown in FIG. 10, an actual measurement database 900 stores the angle of incidence $\Omega$ of ions, the energy E of ions, and the flux $G_2$ of ions while associating these together. Specifically, angles of incidence $\Omega$ of ions, energies of ions E, and fluxes of ions $G_2$ obtained by actually measuring various kinds of plasma are stored in the actual measurement database 900. Thus, by performing a search using an angle of incidence $\Omega$ of ions and an energy E of ions as arguments, the actual measurement data of the flux $G_2$ of ions corresponding to the arguments can be identified.

Next, a normal vector of fluxes of ions arriving at the processing surface is computed as the vector of the progress of surface reaction on the processing surface of the $SiO_2$ layer 731 (S209). Specifically, the vectors of the incidence of fluxes $G_2'$ of ions arriving at the processing surface computed in S2072 are added together to compute a normal vector of fluxes $G_2'$ of ions, and the normal vector is set as the vector of the progress of surface reaction on the processing surface.

Subsequently, the shape change of the $SiO_2$ layer 731 due to etching is computed (S211). For example, a known simulation is performed on the basis of the vector of the progress of surface reaction computed in S209, and thereby the probability of disappearance of voxels of the processing surface in the two-dimensional voxel model is predicted; thus, the shape change of the $SiO_2$ layer 731 can be computed.

Next, the damage distribution of the Si substrate 711 due to ions and light is computed (S213). Specifically, damage that ions and light give to the Si substrate 711 is computed by using different models for a region where ions and light enter and a region where only light enters. Note that the direction of damage to the Si substrate 711 may be the same as the direction of the vector of the progress of surface reaction computed in S209. For example, the damage distribution of the Si substrate 711 due to ions and light can be computed by, as described above, performing computation using a Slab model in which the processing surface is divided into a plurality of thin pieces.

Subsequently, the time elapsed from the start of etching is caused to advance by an amount of a time step (S215), and then it is determined whether the elapsed time has reached a set time or not (S217). In a case where the elapsed time has not reached the set time (S217/No), the processing returns to S203 and the computation is continued in order to compute the damage distribution of the Si substrate 711 in the next time step. On the other hand, in a case where the elapsed time has reached the set time (S217/Yes), the computation is ended.

A result of the computation by the above first specific example is shown in FIG. 11 as well. In a damage distribution prediction 771 shown in FIG. 11, it is predicted that a region nearer to the exposed surface of the Si substrate 711 will receive larger damage. Further, as a result of the computation, the entry length of ions to the Si substrate 711 is found to be approximately 10 nm, and it is predicted that damage due to light will be predominant in areas of the Si substrate 711 deeper than the entry length mentioned above.

Note that, depending on the kind of gas and the material of the workpiece, there is a case where the entry length of ions to the workpiece is longer than the entry length of light. For example, in high-energy etching on silicon using a gas containing hydrogen atoms, there may be a case where the entry length of hydrogen ions to the workpiece is longer than the entry length of ultraviolet rays. Even in such a case, the damage distribution of the workpiece can be predicted more accurately by performing modeling while distinguishing between a region where ultraviolet rays and hydrogen ions enter and a region where only hydrogen ions enter.

(Second Specific Example)

Next, a second specific example in which damage due to etching is predicted is described with reference to FIG. 12 to FIG. 14. The second specific example is an example in which the flux of ions arriving at a processing surface is computed by sheath simulation.

Figure 12:
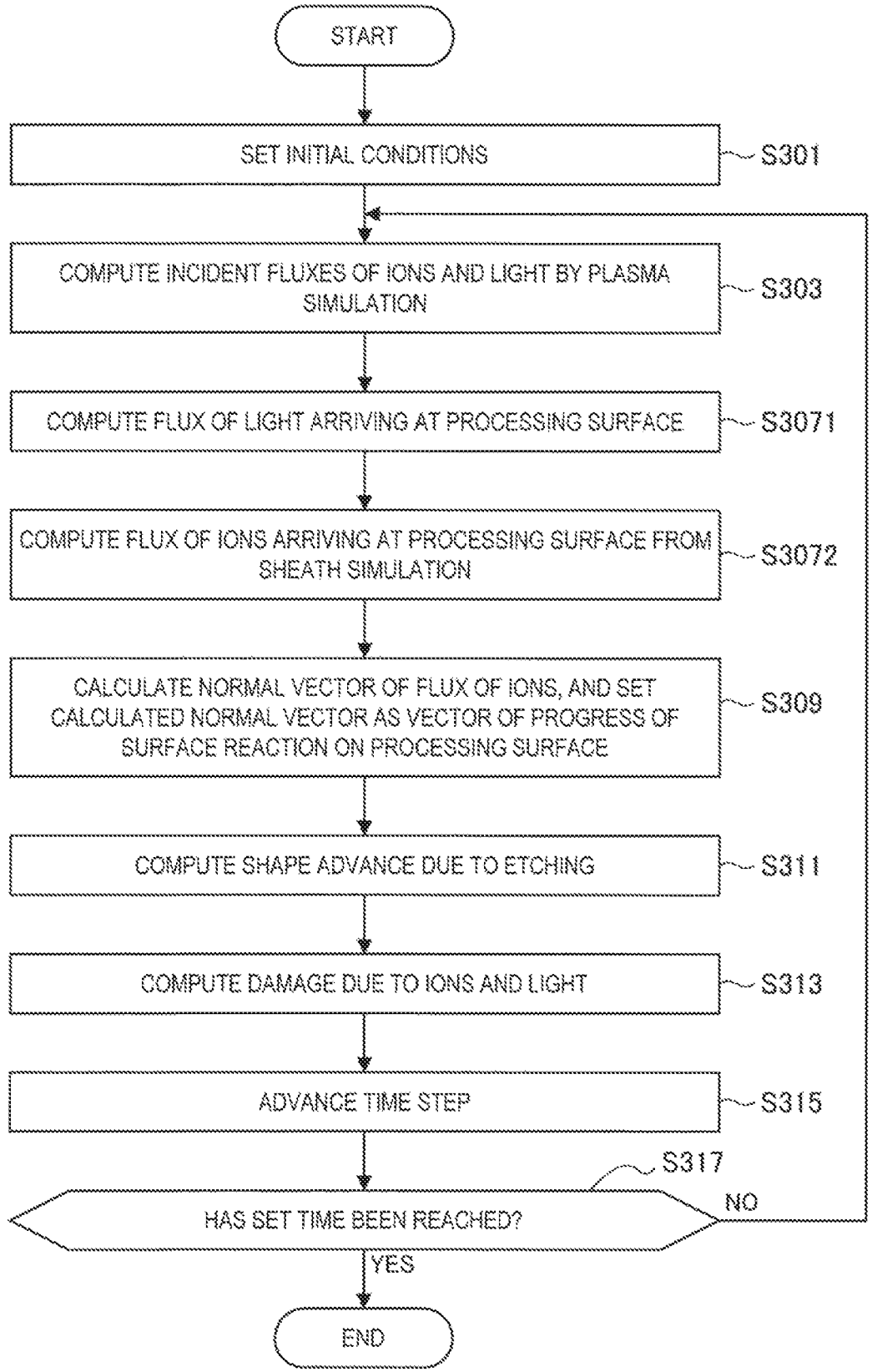
FIG. 12 is a flow chart describing a flow of a damage prediction method in a second specific example.

FIG. 12 is a flow chart describing a flow of a damage prediction method in the second specific example. Further, FIG. 13 is a graph showing an example of a result of computation by a sheath simulation. Further, FIG. 14 is a cross-sectional diagram schematically showing a workpiece serving as a processing object and a result of prediction of damage distribution.

As shown in FIG. 12, first, initial conditions are set (S301). In the second specific example, the following conditions were set as initial conditions.

Figure 14:
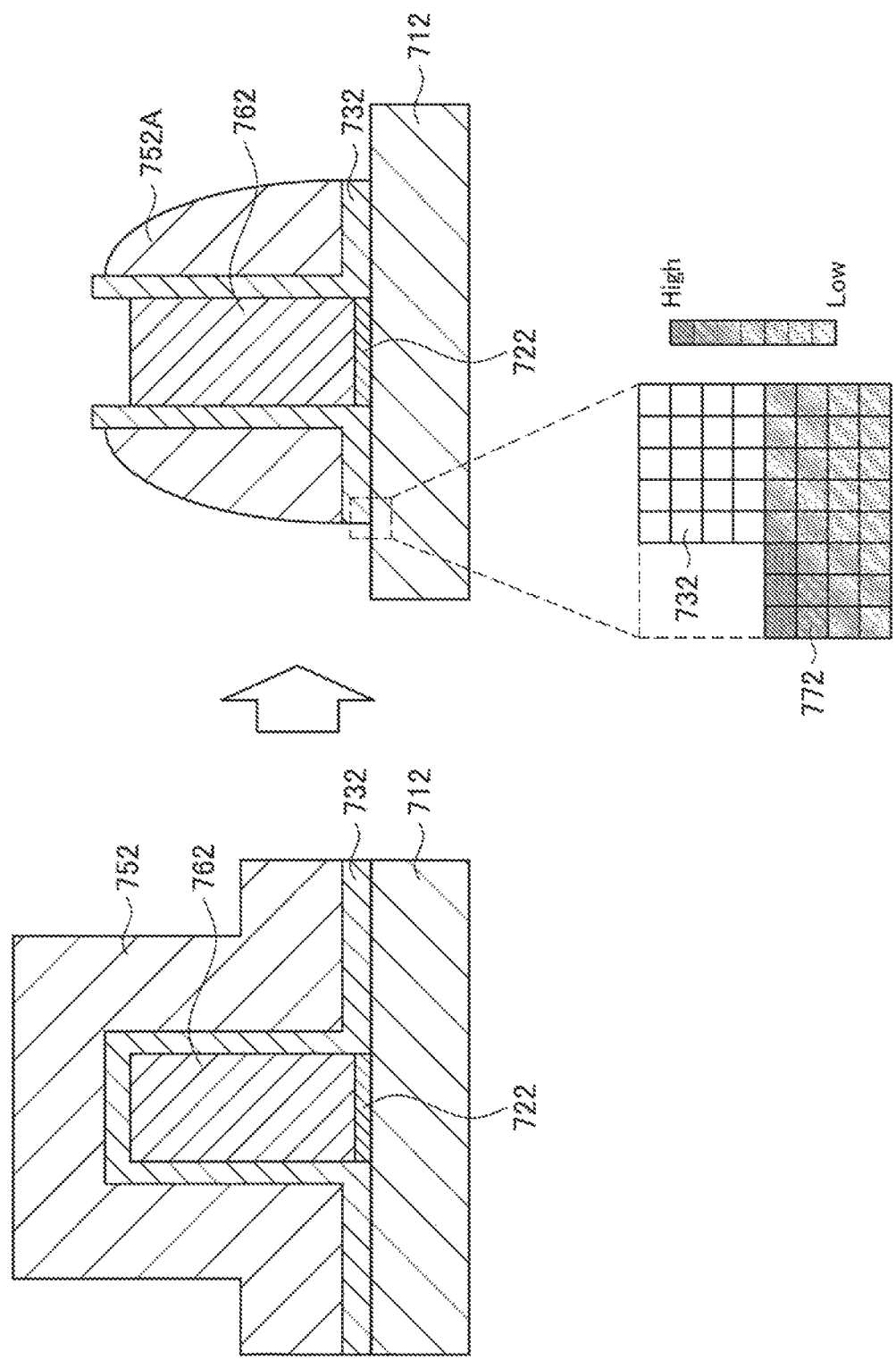
FIG. 14 is a cross-sectional diagram schematically showing a workpiece serving as a processing object and a result of prediction of damage distribution in the specific example.

For example, as shown in FIG. 14, an intermediate body of a metal-oxide-semiconductor (MOS) transistor including a Si substrate 712, a gate insulating film 722 provided using $SiO_2$ on the Si substrate 712, a gate electrode 762 provided using poly-Si on the gate insulating film 722, a first insulating layer 732 provided using $SiO_2$ over the entire Si substrate 712 and the entire gate electrode 762, and a second insulating layer 752 provided using SiN over the entire first insulating layer 732 was set as a workpiece serving as a processing object.

Note that the film thickness of each of the gate insulating film 722 and the first insulating layer 732 was set to 2 nm, the film thickness of the gate electrode 762 was set to 150 nm, and the film thickness of the second insulating layer 752 was set to 70 nm. That is, the second specific example is an example in which damage to the Si substrate 712 due to overall etching (what is called etchback) when forming a side wall 752A in a MOS transistor is computed.

Further, process conditions and apparatus conditions were set as follows. The etching apparatus was of a capacitively coupled plasma (CCP) type, and the frequency of the applied voltage was set to 2 MHz for electrodes for ion drawing-in and to 60 MHz for electrodes for plasma generation. Further, the source power and the bias power were set to 500 W and 100 W, respectively. Note that the mechanism for plasma generation may be another mechanism such as an ICP type or an ECR type.

The etching gas was a mixed gas of $C_4F_8$, $O_2$, and Ar, and the ratio between the flow rates was set to $CH_2F_2:O_2:Ar=60:30:300$ (sccm). Note that seem indicates the flow rate per minute ($cm^3$/min) of gas at 0° C. and 1 atmosphere; in a case where the flow rate is shown in the SI unit system, it is $CH_2F_2:O_2:Ar=101.4\times10^{-4}:50.7\times10^{-4}:507\times10^{-4}$ (Pa·$m^3$/sec). The pressure of the interior of a chamber in which the workpiece was processed was set to 20 mTorr (2.7 Pa), and the etching time was set to 50 seconds. Further, the energy of ions generated by plasma was set to 350 V.

Further, the shape change of the second insulating layer 752 was modeled with a two-dimensional voxel model in which a square with a length of one side of 2 nm was taken as 1 voxel, for example. However, the shape change of the second insulating layer 752 may be modeled with another model, and may be modeled using a level-set method, a string method, or the like.

Next, the incident fluxes of ions and light (specifically, ultraviolet rays) generated by plasma are computed by plasma simulation (S303). For example, the fluxes of ions and light incident on the workpiece can be computed by using a computation method disclosed in Kuboi et al., Japanese Journal of Applied Physics, 49, 08JD01 (2010) or JP 2013-115354A, while taking into account also the state of the wall surface of the chamber in which the workpiece is processed. Note that the wavelength region of the flux of light was set to 250 nm to 270 nm, which is the light emitting region of $CF_2$ gas, an etchant.

Subsequently, the flux of light arriving at the processing surface of the second insulating layer 752 is computed using the incident flux of light computed by plasma simulation (S3071). For example, the angle step $d\Omega$ with which ray tracing is performed is set to 1.5 degrees, reflection at the side surface of the second insulating layer 752 is assumed to be mirror reflection, and the reflection probability is set to 0.1 for simplification, and the computation described above is performed; thereby, the flux $F_2'$ of light arriving at the processing surface of the second insulating layer 752 can be computed.

Next, the flux of ions arriving at the processing surface of the second insulating layer 752 is computed by sheath simulation (S3072). For example, the angle of incidence of ions and the distribution of energies of ions can be derived by using a sheath simulation disclosed in Kushner, Journal of Applied Physics, 58, 4024 (2014) or the like, while taking into account the effect of collision between ions and other particles such as gas molecules in a sheath. Thus, the flux $G_2'$ of ions incident on the processing surface of the second insulating layer 752 can be computed by using information derived by the sheath simulation.

Here, the computation of the flux $G_2'$ of ions using a sheath simulation is specifically described with reference to FIG. 13.

Figure 13:
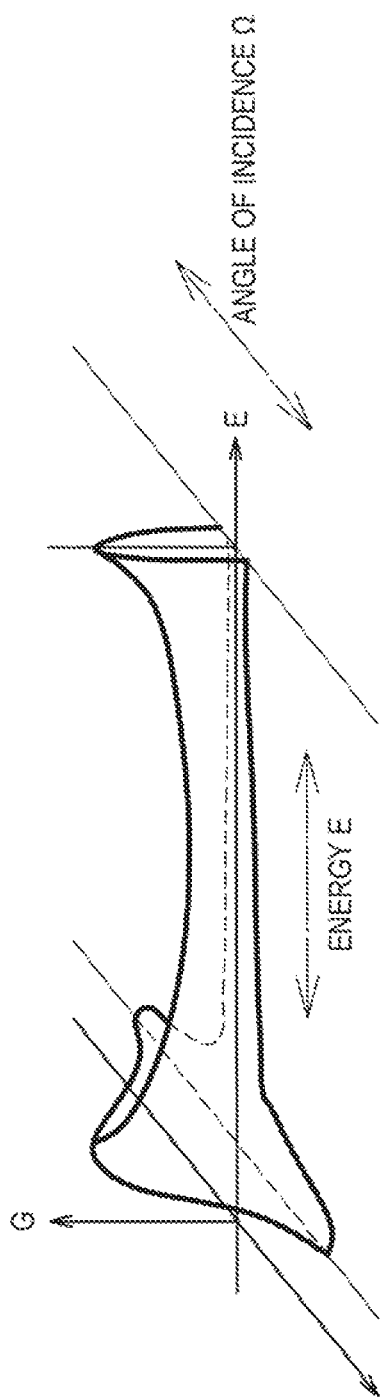
FIG. 13 is a graph showing an example of a result of computation by a sheath simulation.

As shown in FIG. 13, a three-dimensional graph in which the angle of incidence $\Omega$ of ions, the energy E of ions, and the flux G of ions are shown on coordinate axes can be derived by using a sheath simulation. That is, corresponding relationships between the angle of incidence $\Omega$ of ions, the energy E of ions, and the flux G of ions can be predicted by using a three-dimensional graph computed by a sheath simulation.

Specifically, first, ray tracing is performed from the processing surface of the second insulating layer 752, and thereby the angle of incidence of ions on the workpiece is computed. Next, the flux $G_2$ of ions corresponding to the computed angle of incidence and the energy of ions is derived from the three-dimensional graph computed by the sheath simulation. Subsequently, the calculated flux $G_2$ of ions is subjected to an operation using the number of times of reflection derived by ray tracing and the reflection probability; thereby, the flux $G_2'$ of ions arriving at the processing surface of the second insulating layer 752 can be computed. Note that the angle step $d\Omega$ with which ray tracing is performed may be set to, for example, 1.5 degrees, and reflection at the second insulating layer 752 may be assumed to be, for example, mirror reflection with a reflection probability of 0.1.

Next, a normal vector of fluxes of ions arriving at the processing surface is computed as the vector of the progress of surface reaction on the processing surface of the second insulating layer 752 (S309). Specifically, the vectors of the incidence of fluxes $G_2'$ of ions arriving at the processing surface computed in S3072 are added together to compute a normal vector of fluxes $G_2'$ of ions, and the normal vector is set as the vector of the progress of surface reaction on the processing surface.

Subsequently, the shape change of the second insulating layer 752 due to etching is computed (S311). For example, a known simulation is performed on the basis of the vector of the progress of surface reaction computed in S309, and thereby the probability of disappearance of voxels of the processing surface in the two-dimensional voxel model is predicted; thus, the shape change of the second insulating layer 752 can be computed.

Next, the damage distribution of the Si substrate 712 due to ions and light is computed (S313). Specifically, damage given to the Si substrate 712 is computed by using different models for a region where ions and light enter and a region where only light enters. Note that the direction of damage to the Si substrate 712 may be the same as the direction of the vector of the progress of surface reaction computed in S209. For example, the damage distribution of the Si substrate 712 due to ions and light can be computed by, as described above, performing computation using a Slab model in which the processing surface is divided into a plurality of thin pieces.

Subsequently, the time elapsed from the start of etching is caused to advance by an amount of a time step (S315), and then it is determined whether the elapsed time has reached a set time or not (S317). In a case where the elapsed time has not reached the set time (S317/No), the processing returns to S303 and the computation is continued in order to compute the damage distribution of the Si substrate 712 in the next time step. On the other hand, in a case where the elapsed time has reached the set time (S317/Yes), the computation is ended.

A result of the computation by the above second specific example is shown in FIG. 14 as well. In a damage distribution prediction 772 shown in FIG. 14, it is predicted that damage will be distributed strongly in a region of the Si substrate 712 that is not covered with the side wall 752A and that both ions and light directly arrive at. Further, it is predicted that, in a region of the Si substrate 712 covered with the side wall 752A, damage due to light will be distributed weakly, because ions do not arrive directly.

(Third Specific Example)

Figure 15:
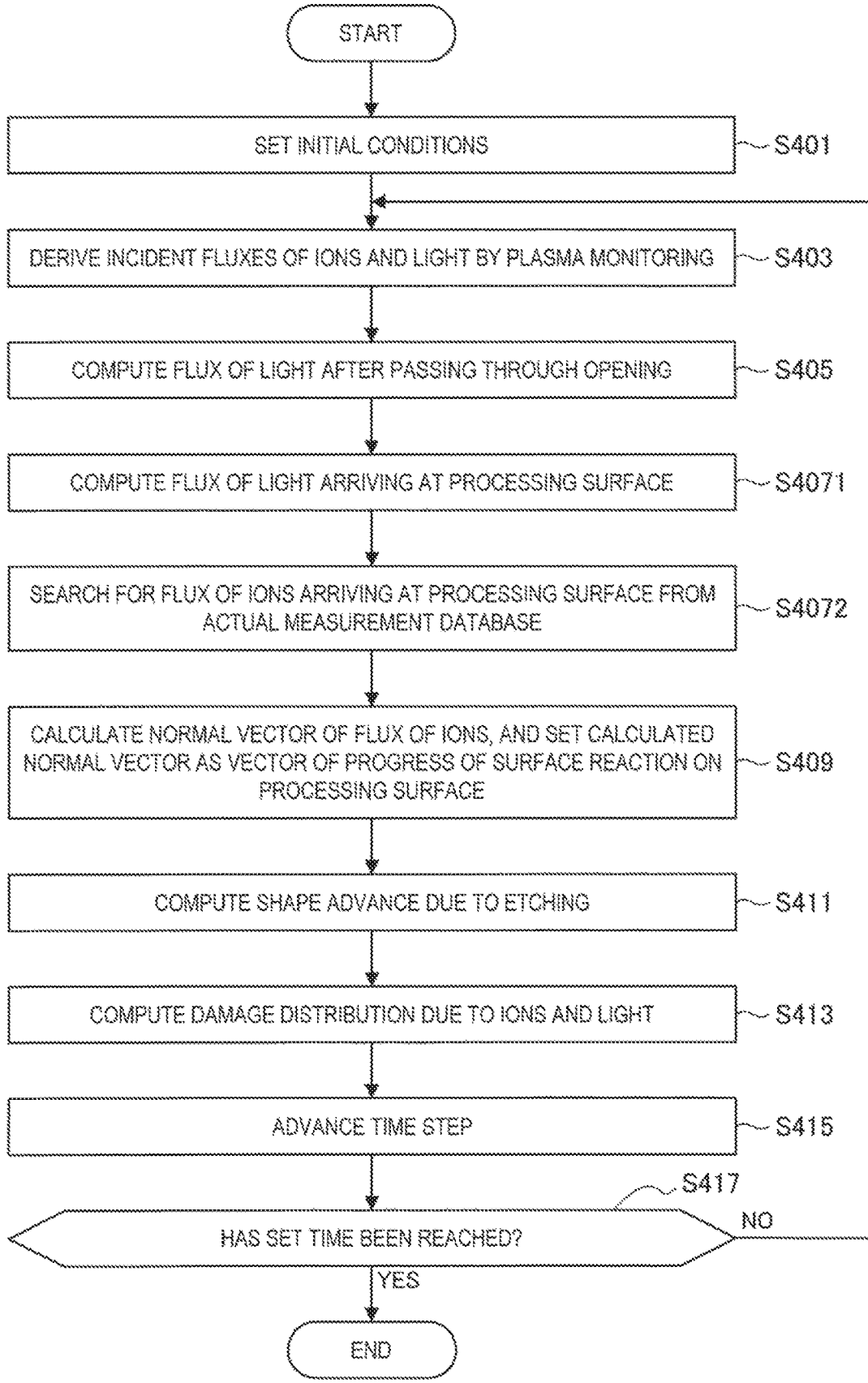
FIG. 15 is a flow chart describing a flow of a damage prediction method in a third specific example.

Next, a third specific example in which damage due to etching is predicted is described with reference to FIG. 15. The third specific example is an example in which the incident fluxes of ions and light generated by plasma are derived from actual measurement values. FIG. 15 is a flow chart describing a flow of a damage prediction method in the third specific example.

As shown in FIG. 15, first, initial conditions are set (S401). Note that the third specific example differs from the first specific example only in the method for deriving the incident fluxes of ions and light generated by plasma. Hence, S401, and S405 to S417 of the third specific example are substantially similar to S201, and S205 to S217, and therefore a description herein is omitted. Note that it goes without saying that, for S4072, the flux of ions may be computed not using an actual measurement database but using simulation similarly to S3072.

Next, plasma in the interior of a chamber in which a workpiece is processed is monitored, and thereby the incident fluxes of ions and light (specifically, ultraviolet rays) generated by plasma are derived (S403).

For example, the flux of light incident on the workpiece can be computed by performing a computation disclosed in JP 2013-115355A, using information obtained by monitoring the interior of the chamber with an optical emission spectroscope (OES). Further, the fluxes of ions and radicals incident on the workpiece can be computed by using information obtained by monitoring the interior of the chamber with a quadropole mass spectroscope (QMS) and an infrared laser absorption spectroscope (IRLAS).

2. SECOND EMBODIMENT (2.1. Overview)

Figure 16:
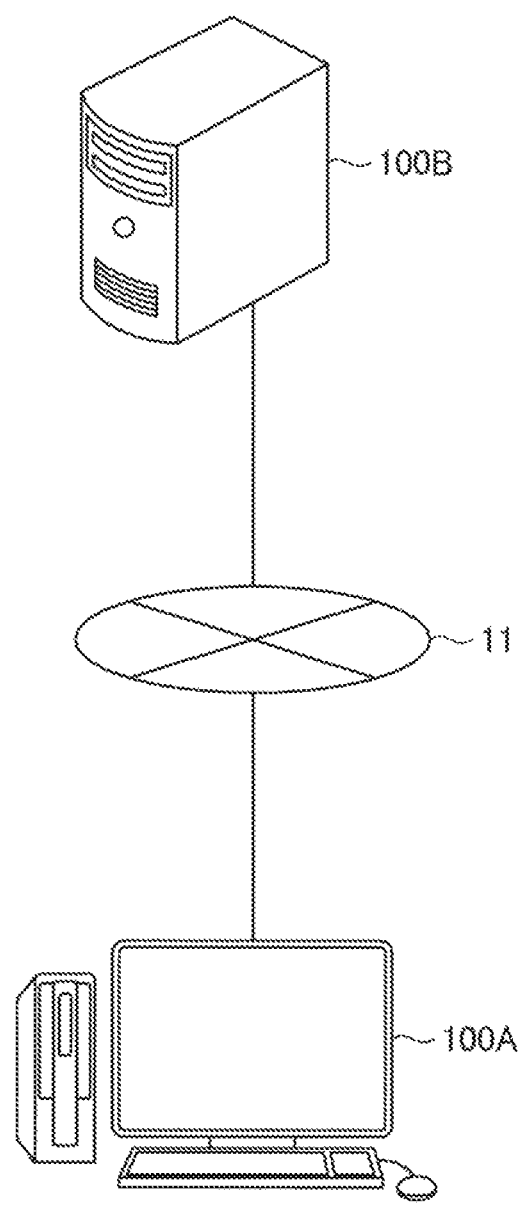
FIG. 16 is an explanatory diagram describing an information processing apparatus that executes a program according to a second embodiment of the present disclosure.

Next, an overview of a program according to a second embodiment of the present disclosure is described with reference to FIG. 16. FIG. 16 is an explanatory diagram describing an information processing apparatus that executes a program according to the second embodiment of the present disclosure.

The program according to the present embodiment is a program that executes the damage prediction method according to the first embodiment described above. The program according to the present embodiment may, for example, be programmed in a known programming language; for example, may be programmed in a programming language such as C, $C^{++}$, Fortran, or JAVA (registered trademark). Note that the present embodiment includes a storage medium in which a program that executes the damage prediction method according to the first embodiment described above is stored.

As shown by FIG. 16, the program according to the present embodiment may be executed by an information processing apparatus 100A such as a computer, for example.

Further, the program according to the present embodiment may be executed by cooperation of the information processing apparatus 100A and an information processing server 100B connected by a network 11. In such a case, processing with large computational complexity can be caused to be executed by the information processing server 100B, which has higher operation capacity, and therefore the speed of execution of the program according to the present embodiment can be improved.

Note that the network 11 that connects the information processing apparatus 100A and the information processing server 100B together may be a public network such as the Internet, or may be a network covering a limited small area, such as a local area network (LAN).

(2.2. Configuration Example of Damage Prediction Apparatus)

Figure 17:
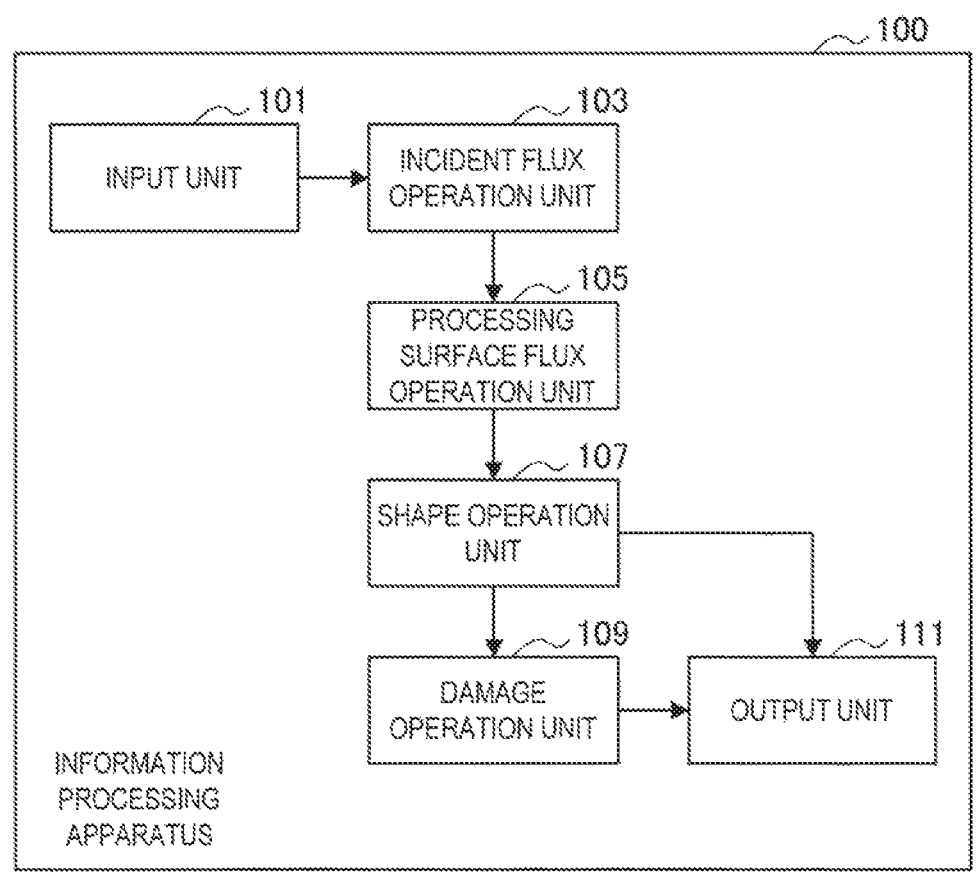
FIG. 17 is a block diagram showing a functional configuration of an information processing apparatus that executes a program according to the embodiment.

Next, a configuration example of an information processing apparatus that executes the program according to the present embodiment is described with reference to FIG. 17. FIG. 17 is a block diagram showing a functional configuration of an information processing apparatus that executes the program according to the present embodiment. Note that an information processing apparatus 100 of FIG. 17 expresses either of the information processing apparatus 100A shown in FIG. 16 and an information processing system including the information processing apparatus 100A and the information processing server 100B.

As shown in FIG. 17, the information processing apparatus 100 includes an input unit 101, an incident flux operation unit 103, a processing surface flux operation unit 105, a shape operation unit 107, a damage operation unit 109, and an output unit 111. Note that the execution platform of the information processing apparatus 100 that executes the program according to the present embodiment may be any of Windows (registered trademark), Linux (registered trademark), Unix (registered trademark), Mac OS (registered trademark), OS X (registered trademark), etc.

In a damage prediction method, the input unit 101 accepts the input of initial conditions, and transfers the inputted initial conditions to the incident flux operation unit 103. Specifically, recipe information of a process, apparatus information, various parameters used for computation, and information of the shape of a workpiece, the kinds of films, film thicknesses, etc. may be inputted to the input unit 101. The input unit 101 may be a graphical user interface (GUI) or the like displayed on a display apparatus, for example. Further, the configuration language of the GUI may be any of OpenGL (registered trademark), Motif, tcl/tk, etc.

The incident flux operation unit 103 computes the fluxes of ions and light generated by plasma on the basis of inputted initial conditions. Specifically, the incident flux operation unit 103 computes the densities of various kinds of gas in plasma, and computes the distribution of energies of ions generated by plasma and the distribution of angles of incidence on the workpiece. Further, the incident flux operation unit 103 computes the flux of ions from the distribution of energies of ions and the distribution of angles of incidence on the workpiece. Further, the incident flux operation unit 103 computes the flux of light generated by plasma, by a simulation based on the kind of gas and conditions for plasma generation. A specific computation method to be executed by the incident flux operation unit 103 is described in detail in the first embodiment, and therefore a description herein is omitted.

The processing surface flux operation unit 105 computes the open area ratio of a wafer, the open area ratio at a chip level, and influence on the fluxes of ions and light due to the opening of the pattern configuration of the workpiece, from the inputted information of the shape of the workpiece, the layer structure, the film thicknesses, etc. Further, the processing surface flux operation unit 105 uses ray tracing to compute the fluxes of ions and light arriving at the processing surface of the workpiece, from the fluxes of ions and light generated by plasma. A specific computation method to be executed by the processing surface flux operation unit 105 is described in detail in the first embodiment, and therefore a description herein is omitted.

The shape operation unit 107 computes surface reaction due to ions arriving at the processing surface of the workpiece, and computes the shape advance of the processing surface of the workpiece. Specifically, the shape operation unit 107 computes a normal vector in which the vectors of fluxes of ions incident on the processing surface are added together, as the vector of the progress of reaction on the processing surface. Further, the shape operation unit 107 computes the reaction of the processing surface due to the incidence of ions, and computes the shape advance of the processing surface of the workpiece. A known method may be used as a specific shape advance computation method to be executed by the shape operation unit 107, and therefore a description herein is omitted.

The damage operation unit 109 computes the distribution of damage that ions and light give to the workpiece, on the basis of the fluxes of ions and light incident on the processing surface. Specifically, the damage operation unit 109 computes damage that ions and light give to the workpiece by using different models for a region where both ions and light enter and a region where only light enters. Further, the damage operation unit 109 can compute damage due to ions and light simultaneously by using the direction of the vector of the progress of surface reaction as the direction of damage to the workpiece due to ions and light. Note that, although the vector of the progress of surface reaction may be computed by the shape operation unit 107 as described above, it goes without saying that the vector may be computed by the damage operation unit 109. A specific computation method to be executed by the damage operation unit 109 is described in detail in the first embodiment, and therefore a description herein is omitted.

The output unit 111 outputs the computed damage distribution of the workpiece. Further, the output unit 111 may output the shape after processing of the workpiece. The output unit 111 may output the result of computation of the damage distribution of the workpiece as a data file, or may output the result with visualization with an image or the like of a GUI or the like. Any of OpenGL, Motif, tcl/tk, etc. may be used as the configuration language of the GUI. Further, the output unit 111 may collectively output the outputs of results of computation of the damage distribution of the workpiece after the end of computation, or may output results on a real time basis during computation.

The information processing apparatus 100 can achieve the function described above by executing the program according to the present embodiment. Thereby, the information processing apparatus 100 can predict the damage distribution of a workpiece in a plasma process more accurately in a practical computation time.

(2.3. Hardware Configuration)

Figure 18:
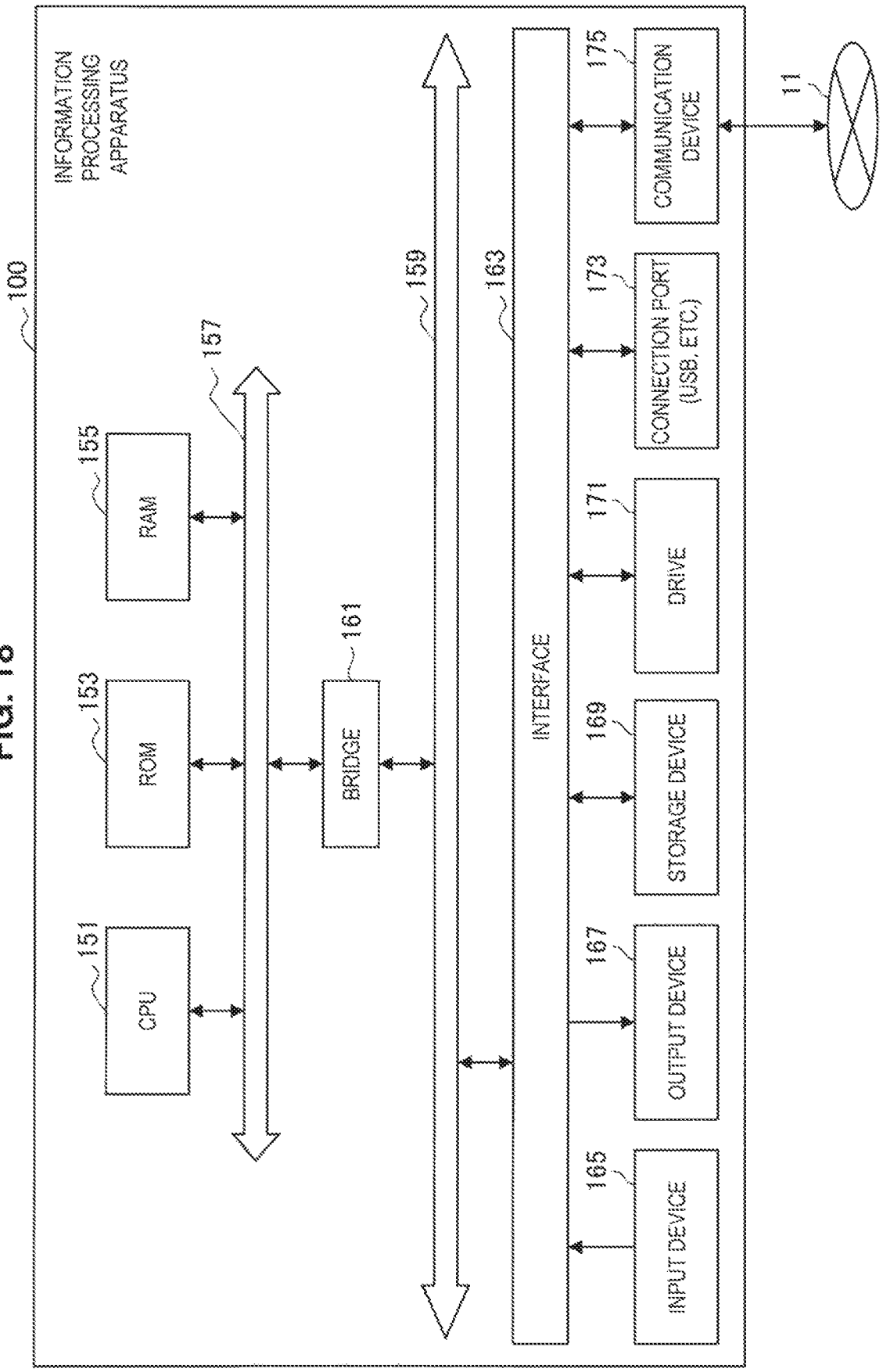
FIG. 18 is a block diagram showing a hardware configuration example of an information processing apparatus that executes a program according to the embodiment.

Next, a hardware configuration of the information processing apparatus that executes the program according to the present embodiment will be described with reference to FIG. 18. The program according to the present embodiment implements the functional configuration illustrated in FIG. 17, by cooperating with the hardware illustrated in FIG. 18, in order to execute the damage prediction method described in the first embodiment. FIG. 18 is a block diagram that illustrates a hardware configuration example of the information processing apparatus that executes the program according to the present embodiment.

As illustrated in FIG. 18, the information processing apparatus 100 includes a central processing unit (CPU) 151, a read only memory (ROM) 153, a random access memory (RAM) 155, a bridge 161, internal buses 157 and 159, an interface 163, an input device 165, an output device 167, a storage device 169, a drive 171, a connection port 173, and a communication device 175.

The CPU 151 functions as a computation processing device and a control device, and controls the overall operation of the information processing apparatus 100, in accordance with various types of programs (program according to the present embodiment, etc.) stored in the ROM 153 or the like. The ROM 153 stores the programs and the calculation parameters used by the CPU 151, and the RAM 155 temporarily stores the programs used in the execution of the CPU 151, and the parameters that changes as appropriate in the execution. For example, the CPU 151 may execute the functions of the incident flux operation unit 103, the processing surface flux operation unit 105, the shape operation unit 107, the damage operation unit 109, etc.

The CPU 151, the ROM 153, and the RAM 155 are connected to each other by the bridge 161, the internal buses 157 and 159, etc. Also, the CPU 151, the ROM 153, and the RAM 155 are connected to the input device 165, the output device 167, the storage device 169, the drive 171, the connection port 173, and the communication device 175 via the interface 163.

The input device 165 includes input means by which various types of information can be input, such as a touch panel, a keyboard, a mouse, a button, a microphone, a switch, and a lever. Also, the input device 165 includes an input control circuit for generating an input signal on the basis of input information and outputting the input signal to the CPU 151. For example, the input device 165 may execute the function of the input unit 101.

The output device 167 includes a display device such as a cathode ray tube (CRT) device, a liquid crystal display device, and an organic electroluminescence display device. In addition, the output device 167 includes an audio output device such as a speaker and a headphone, for example. For example, the output device 167 may execute the function of the output unit 111 or the like.

The storage device 169 is a device for data storage configured as an example of the storage unit of the information processing apparatus 100. The storage device 169 may include a storage medium, a storage device that stores data in the storage medium, a readout device that reads out data from the storage medium, and a deleting device that deletes stored data.

The drive 171 is a storage medium reader-writer, and is provided inside or outside the information processing apparatus 100. For example, the drive 171 reads out the information stored in a removable storage medium, such as a set magnetic disk, an optical disc, a magneto-optical disk, or a semiconductor memory, and outputs the information to the RAM 153. Also, the drive 171 can write the information into the removable storage medium.

The connection port 173 is a connection interface including a connection port for connecting an external connection device, such as a universal serial bus (USB) port, an Ethernet (registered trademark) port, an IEEE802.11 standard port, and an optical audio terminal, for example.

The communication device 175 is a communication interface configured with a communication device or the like for connecting to the network 11, for example. Also, the communication device 175 may be a cable communication device that performs wired cable communication, and may be a wired or wireless LAN compatible communication device.

As described above, according to the program according to the present embodiment, the damage prediction method according to the first embodiment can be executed by the computation processing device.

3. THIRD EMBODIMENT (3.1. Overview)

Figure 19:
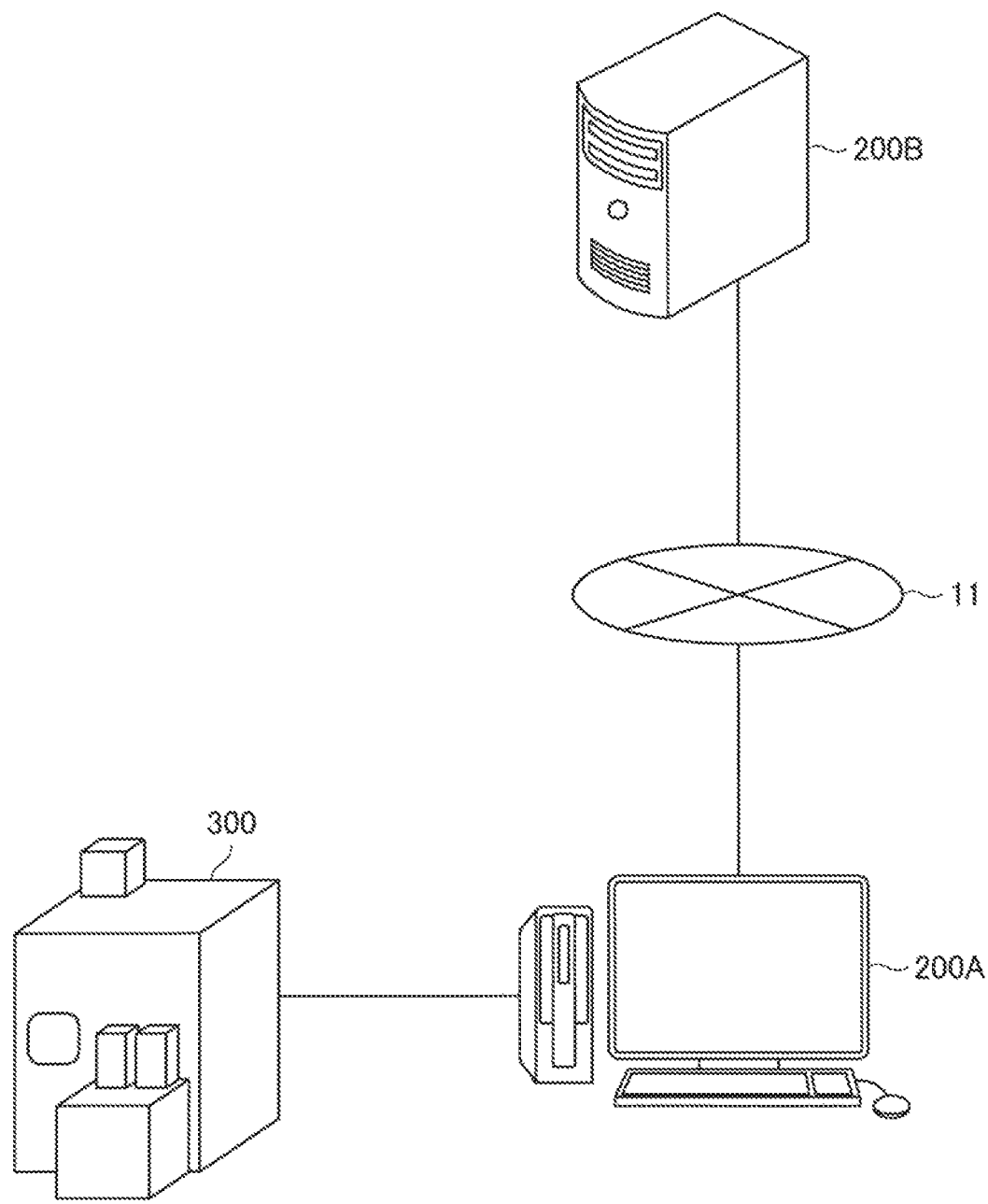
FIG. 19 is an explanatory diagram describing an overview of a semiconductor processing system according to a third embodiment of the present disclosure.

Next, an overview of a semiconductor processing system according to a third embodiment of the present disclosure is described with reference to FIG. 19. FIG. 19 is an explanatory diagram describing an overview of a semiconductor processing system according to the third embodiment of the present disclosure.

As shown in FIG. 19, the semiconductor processing system according to the present embodiment includes a semiconductor processing apparatus 300 and an information processing apparatus 200A that executes the damage prediction method according to the first embodiment. Note that the information processing apparatus 200A may execute the damage prediction method according to the first embodiment in cooperation with an information processing server 200B connected by a network 11.

The semiconductor processing system according to the present embodiment is a semiconductor processing system that, using the damage prediction method according to the first embodiment described above, performs feedback correction to process conditions so that damage due to a plasma process is optimized.

The semiconductor processing apparatus 300 is an apparatus that processes a semiconductor by using plasma. For example, the semiconductor processing apparatus 300 may be any of an etching apparatus, a PVD apparatus, a CVD apparatus, a plasma ashing apparatus, and a plasma cleaning apparatus. Further, the plasma used by the semiconductor processing apparatus 300 may be, for example, high-frequency plasma, ECR plasma, capacitively coupled plasma, inductively coupled plasma, helicon wave plasma, UHF or VHF plasma, or the like, or may be plasma generated by another mechanism.

The information processing apparatus 200A is, for example, a computer or the like, and executes the damage prediction method according to the first embodiment. Further, the information processing apparatus 200A may cause the information processing server 200B to execute part of the operations of the damage prediction method according to the first embodiment. By causing processing with large computational complexity to be executed by the information processing server 200B, which has high operation capacity, the information processing apparatus 200A can improve the computation speed of the damage prediction method. Note that the network 11 that connects the information processing apparatus 200A and the information processing server 200B together is similar to that described in the second embodiment, and therefore a description herein is omitted.

(3.2. Configuration Example of Semiconductor Processing System)

Figure 20:
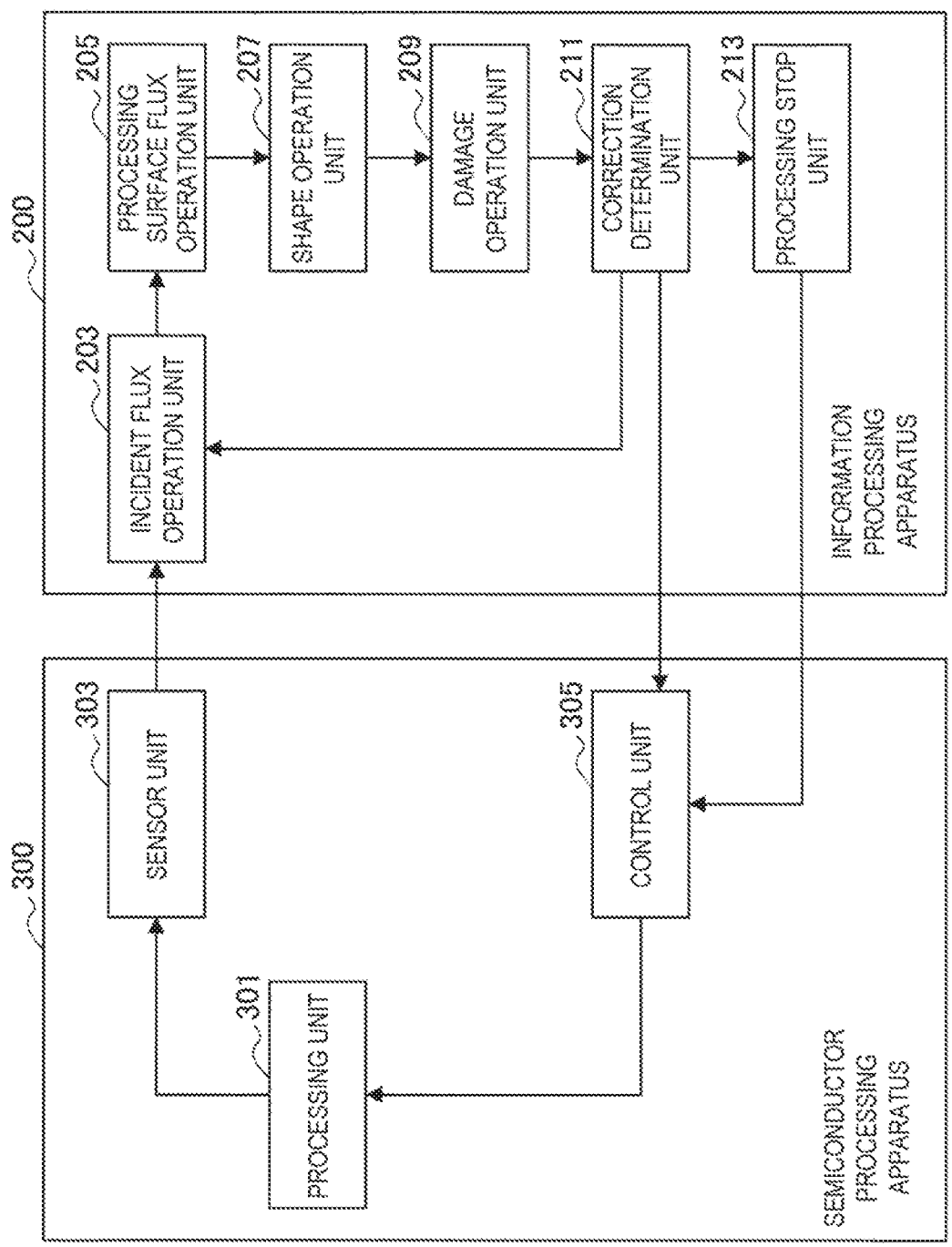
FIG. 20 is a block diagram showing a functional configuration of a semiconductor processing system according to the embodiment.

Next, a configuration example of a semiconductor processing system according to the present embodiment is described with reference to FIG. 20. FIG. 20 is a block diagram showing a functional configuration of a semiconductor processing system according to the present embodiment. Note that an information processing apparatus 200 of FIG. 20 expresses either of the information processing apparatus 200A shown in FIG. 19 and a system including the information processing apparatus 200A and the information processing server 200B.

As shown in FIG. 20, the semiconductor processing apparatus 300 includes a processing unit 301, a sensor unit 303, and a control unit 305. Further, the information processing apparatus 200 includes an incident flux operation unit 203, a processing surface flux operation unit 205, a shape operation unit 207, a damage operation unit 209, a correction determination unit 211, and a processing stop unit 213.

(Semiconductor Processing Apparatus 300)

The processing unit 301 includes a chamber in which processing on a semiconductor wafer or the like that is a workpiece is performed. For example, the processing unit 301 causes gas introduced in the interior of the chamber to be electrically dissociated and thereby generates plasma, and performs etching, film formation, ashing, cleaning, etc. on the workpiece. The process performed in the processing unit 301 is not particularly limited as long as it is a process using plasma.

The sensor unit 303 measures information regarding the interior of the processing unit 301. Specifically, the sensor unit 303 measures the state, etc. of plasma in the interior of the processing unit 301 by means of a sensor or the like provided in the processing unit 301, and transfers the measured information to the information processing apparatus 200.

The sensor or the like provided in the processing unit 301 may be, for example, an optical emission spectrometer (optical emission spectrometry; OES), a mass spectrometer (quadrupole mass spectrometry; QMS), an absorption spectrometer (infrared laser absorption spectroscopy; IRLAS), an energy spectrum analyzer, or the like. By these sensors or the like, the sensor unit 303 can constantly monitor the state of plasma in the interior of the processing unit 301. The measurement by the sensor unit 303 may be performed at a sampling rate of 0.1 seconds, for example.

The control unit 305 controls process conditions in the processing unit 301. Specifically, in a case where the control unit 305 has received a correction to a process condition from the correction determination unit 211 of the information processing apparatus 200, the control unit 305 controls the process condition in the processing unit 301 on the basis of the received correction. Further, in a case where the control unit 305 has received a stop instruction from the processing stop unit 213 of the information processing apparatus 200, the control unit 305 causes processing in the processing unit 301 to stop. That is, the control unit 305 controls the overall processing in the processing unit 301, and furthermore can cause the result of the damage prediction method executed by the information processing apparatus 200 to be reflected in the processing unit 301.

(Information Processing Apparatus 200)

The incident flux operation unit 203 computes the incident fluxes of ions and light generated by plasma. Specifically, the incident flux operation unit 203 computes the gas density of the interior of the processing unit 301 and the energy of ions on the basis of information regarding the state of plasma measured by the sensor unit 303, and computes the incident fluxes of ions and light generated by plasma. Further, in a case where the computation time is much shorter than the actual processing time, the incident flux operation unit 203 may compute the incident fluxes of ions and light generated by plasma by plasma simulation.

The processing surface flux operation unit 205, the shape operation unit 207, and the damage operation unit 209 are substantially similar to the processing surface flux operation unit 105, the shape operation unit 107, and the damage operation unit 109 described in the second embodiment, and therefore a description herein is omitted.

The correction determination unit 211 determines corrections to process conditions in a case where the shape of the workpiece and the damage distribution computed by the shape operation unit 207 and the damage operation unit 209 have exceeded desired prescribed values. Specifically, in a case where the shape of the workpiece and the damage distribution predicted on the basis of the state of the interior of the processing unit 301 exceed desired prescribed values, the correction determination unit 211 finds process conditions satisfying the desired prescribed values, and determines corrections to the current process conditions.

For example, in an etching process, in a case where a value of variation in the dimensions of a concavity formed by etching is more than or equal to ±10% or in a case where damage to the workpiece is higher than a desired prescribed value (for example, the number of defects being $10^{11}/cm^2$) by more than or equal to 50%, the correction determination unit 211 changes process conditions each by ±50% at a time in the order of the flow rate, the gas pressure, and the application power of the source gas, and the temperature of the wafer, and causes the incident flux operation unit 203, the processing surface flux operation unit 205, the shape operation unit 207, and the damage operation unit 209 to compute the shape of the workpiece and the damage distribution again. By repeating this, the correction determination unit 211 finds process conditions whereby the shape of the workpiece and the damage distribution predicted by computation satisfy the desired prescribed values, and determines corrections to the current process conditions.

On the other hand, in a case where the correction determination unit 211 cannot find process conditions satisfying the desired prescribed values, the correction determination unit 211 transmits an alert signal to the processing stop unit 213, and may cause processing by the processing unit 301 to stop.

Note that, in a case where the computation time is substantially equal to the actual processing time, the information processing apparatus 200 may, for example, prepare in advance a database in which perturbation computations have been performed on various process conditions. In such a case, the correction determination unit 211 may search the database and thereby find process conditions whereby the shape of the workpiece and the damage distribution satisfy the desired prescribed values.

The correction determined by the correction determination unit 211 is transmitted to the control unit 305 of the semiconductor processing apparatus 300, and is thereby reflected in the process conditions in the processing unit 301.

In a case where it is determined that it is difficult to form a desired workpiece, the processing stop unit 213 causes processing by the semiconductor processing apparatus 300 to stop. Specifically, in a case where the correction determination unit 211 has determined that process conditions for forming a workpiece with a shape and a damage distribution satisfying the desired prescribed values cannot be found, the processing stop unit 213 causes processing in the semiconductor processing apparatus 300 to stop. The processing stop unit 213 may be, for example, a fault detection and classification/equipment engineering system (FDC/EES) or the like. By the processing stop unit 213, in a case where it is difficult to form a desired workpiece, measures to errors can be taken in an earlier stage by causing the semiconductor processing apparatus 300 to stop in an earlier stage.

By the semiconductor processing system according to the present embodiment, the damage distribution of a workpiece in a plasma process is predicted, and a correction based on the prediction result is fed back to process conditions; thereby, a semiconductor element having desired characteristics can be formed with good efficiency.

Note that, although in the above the present embodiment is described as a system including the semiconductor processing apparatus 300 and the information processing apparatus 200, the technology according to the present disclosure is not limited to such an example. For example, the present embodiment may be a semiconductor processing apparatus in which the semiconductor processing apparatus 300 and the information processing apparatus 200 are integrated together.

4. CONCLUSIONS

As described in detail hereinabove, in the damage prediction method according to the first embodiment of the present disclosure, light is treated as a wave and diffraction at an opening of a workpiece can be taken into account; thus, the damage distribution of the workpiece can be computed more accurately.

Further, in the damage prediction method according to the first embodiment of the present disclosure, damage to a workpiece can be computed by using different models for a region where both ions and light enter and a region where only light enters. Thus, the damage prediction method according to the first embodiment of the present disclosure can take interaction between ions and light into account, and can therefore compute the damage distribution of the workpiece more accurately.

Further, in the damage prediction method according to the first embodiment of the present disclosure, fluxes are used, and thereby pieces of damage to a workpiece due to ions and light can be computed by a common configuration; therefore, the computation speed can be improved. Thus, the damage prediction method according to the first embodiment of the present disclosure can compute the damage distribution of the workpiece within a practical time.

Further, the program according to the second embodiment of the present disclosure can predict the damage distribution of a workpiece efficiently by using an information processing apparatus to cause the damage prediction method according to the first embodiment to be subjected to arithmetic processing.

Further, the semiconductor processing system according to the third embodiment of the present disclosure can form a workpiece having a desired shape and a desired damage distribution more easily by feeding back the result of the damage prediction method according to the first embodiment.

The preferred embodiment(s) of the present disclosure has/have been described above with reference to the accompanying drawings, whilst the present disclosure is not limited to the above examples. A person skilled in the art may find various alterations and modifications within the scope of the appended claims, and it should be understood that they will naturally come under the technical scope of the present disclosure.

Further, the effects described in this specification are merely illustrative or exemplified effects, and are not limitative. That is, with or in the place of the above effects, the technology according to the present disclosure may achieve other effects that are clear to those skilled in the art from the description of this specification.

Additionally, the present technology may also be configured as below.

(1)

A damage prediction method including:

using an operation apparatus to calculate, from fluxes of ions and light generated by plasma, fluxes of ions and light propagated through a pattern of a workpiece including a processing object, on the basis of the pattern;

calculating, from the fluxes of ions and light propagated through the pattern, fluxes of ions and light arriving at a surface of the processing object, by ray tracing; and calculating, from the fluxes of ions and light arriving at the surface of the processing object, a damage distribution of the processing object.

(2)

The damage prediction method according to (1), in which the pattern is an opening provided in a surface of the workpiece.

(3)

The damage prediction method according to (2), in which the workpiece is the processing object on which a mask is formed, and the opening is provided in the mask.

(4)

The damage prediction method according to (2) or (3), in which the flux of light propagated through the pattern is calculated by a diffraction approximation based on a wavelength of the light and a size of the opening.

(5)
The damage prediction method according to (4),
in which the light is approximated as a plane wave, and the flux of light propagated through the pattern is calculated using Fresnel diffraction of the light and the opening.

(6)
The damage prediction method according to any one of (1) to (5),
in which the flux of ions propagated through the pattern is calculated on the basis of a database in which an energy and an angle of incidence of the ions are arguments, sheath simulation, or actual measurement data.

(7)
The damage prediction method according to any one of (1) to (6),
in which the fluxes of ions and light generated by the plasma are calculated on the basis of simulation or actual measurement data.

(8)
The damage prediction method according to any one of (1) to (7),
in which the fluxes of ions and light arriving at the surface of the processing object are calculated by ray-tracing the fluxes of ions and light propagated through the pattern in units of angles of incidence on the surface of the processing object, and performing an operation on the ray-traced fluxes of ions and light by using the number of times of reflection and a reflection probability.

(9)
The damage prediction method according to any one of (1) to (8),
in which a direction of progress of processing reaction on the surface of the processing object is a direction of a normal vector of the flux of ions arriving at the surface of the processing object.

(10)
The damage prediction method according to any one of (1) to (9),
in which the damage distribution of the processing object is calculated while a shape change of the processing object due to incidence of the ions is taken into account.

(11)
The damage prediction method according to any one of (1) to (10),
in which the damage distribution of the processing object is calculated by performing operations of damage due to ions and light and damage due to light on the basis of entry lengths from the surface of the processing object.

(12)
The damage prediction method according to any one of (1) to (11),
in which a direction of a normal vector of the flux of light arriving at the surface of the processing object is same as a direction of a normal vector of the flux of ions arriving at the surface of the processing object.

(13)
A damage prediction method including:
using an operation apparatus to calculate, from fluxes of ions and light generated by plasma, fluxes of ions and light arriving at a surface of a processing object; and
performing, from the fluxes of ions and light arriving at the surface of the processing object, operations of damage due to ions and light and damage due to light, on the basis of entry lengths from the surface of the processing object, and calculating a damage distribution of the processing object.

(14)
A damage prediction method including:
using an operation apparatus to calculate, from fluxes of ions and light generated by plasma, fluxes of ions and light arriving at a surface of a processing object; and
calculating, from the fluxes of ions and light arriving at the surface of the processing object, a distribution of damage to the processing object, a direction of a normal vector of the flux of light arriving at the surface of the processing object being same as a direction of a normal vector of the flux of ions arriving at the surface of the processing object.

(15)
A program for causing a computer to function as:
an incident flux operation unit configured to calculate, from fluxes of ions and light generated by plasma, fluxes of ions and light propagated through a pattern of a workpiece including a processing object, on the basis of the pattern;
a processing surface flux operation unit configured to calculate, from the fluxes of ions and light propagated through the pattern, fluxes of ions and light arriving at a surface of the processing object, by ray tracing; and
a damage operation unit configured to calculate, from the fluxes of ions and light arriving at the surface of the processing object, a distribution of damage to the processing object.

(16)
A semiconductor processing system including:
an incident flux operation unit configured to calculate, from fluxes of ions and light generated by plasma, fluxes of ions and light propagated through a pattern of a workpiece including a processing object, on the basis of the pattern;
a processing surface flux operation unit configured to calculate, from the fluxes of ions and light propagated through the pattern, fluxes of ions and light arriving at a surface of the processing object, by ray tracing; and
a damage operation unit configured to calculate, from the fluxes of ions and light arriving at the surface of the processing object, a distribution of damage to the processing object.

(17)
The semiconductor processing system according to (16), further including:
a sensor unit configured to measure a state of an interior of a chamber in which the workpiece including the processing object is processed;
a correction determination unit configured to determine a correction to a processing condition of the workpiece on the basis of a damage distribution of the processing object calculated using information measured by the sensor unit; and
a control unit configured to control the processing condition on the basis of the determined correction.

(18)
The semiconductor processing system according to (17), further including:
a processing stop unit configured to cause processing of the workpiece to stop in a case where the correction determination unit is unable to determine the correction.

REFERENCE SIGNS LIST 1 plasma
3 ions
5 light
7 workpiece
71 substrate
73 processing film
75 mask 100, 200 information processing apparatus
101 input unit
103, 203 incident flux operation unit
105, 205 processing surface flux operation unit
107, 207 shape operation unit
109, 209 damage operation unit
111 output unit
211 correction determination unit
213 processing stop unit
300 semiconductor processing apparatus
301 processing unit
303 sensor unit
305 control unit

The invention claimed is:

1. A damage prediction method, comprising:
in an operation apparatus:
calculating a first flux of ions propagated through an opening in a mask and a first flux of light propagated through the opening in the mask, wherein
the mask is on a surface of a processing object, and
the calculation of the first flux of the ions and the first flux of the light is based on a second flux of the ions generated by plasma and a second flux of the light generated by the plasma;
calculating, by ray-tracing, a third flux of the ions arriving at the surface of the processing object and a third flux of the light arriving at the surface of the processing object,
wherein the calculation of the third flux of the ions and the third flux of the light is based on the first flux of the ions and the first flux of the light; and
calculating a damage distribution of the processing object based on the third flux of the ions and the third flux of the light.

2. The damage prediction method according to claim 1, wherein
the first flux of the light propagated through the opening is calculated by a diffraction approximation, and
the calculation of the first flux of the light is further based on a wavelength of the light and a size of the opening in the mask.

3. The damage prediction method according to claim 2, wherein
the light is approximated as a plane wave, and
the calculation of the first flux of the light propagated through the opening is further based on the opening and Fresnel diffraction of the light.

4. The damage prediction method according to claim 1, wherein
the calculation of the first flux of the ions propagated through the opening is further based on one of sheath simulation, actual measurement data, or a database in which an energy and an angle of incidence of the ions are arguments.

5. The damage prediction method according to claim 1, further comprising calculating, based on one of simulation or actual measurement data, the second flux of the ions and the second flux of the light generated by the plasma.

6. The damage prediction method according to claim 1, wherein
the calculation of the third flux of the ions and the third flux of the light arriving at the surface of the processing object is further based on:
the ray-tracing of the first flux of the ions and the first flux of the light in units of angles of incidence on the surface of the processing object, and
execution of a specific operation on the ray-traced first flux of the ions and the ray-traced first flux of the light, and
the execution of the specific operation is based on a number of times of reflection of the ions and the light, and a reflection probability of the ions and the light.

7. The damage prediction method according to claim 1, wherein a direction of progress of processing reaction on the surface of the processing object corresponds to a direction of a normal vector of the third flux of the ions arriving at the surface of the processing object.

8. The damage prediction method according to claim 1, wherein the calculation of the damage distribution of the processing object is further based on a shape change of the processing object due to incidence of the ions.

9. The damage prediction method according to claim 1, further comprising:
determining a first damage due to the ions and the light, and a second damage due to the light, wherein
the determination is based on entry lengths of the ions and the light, and
the entry lengths of the ions and the light are from the surface of the processing object; and
calculating the damage distribution based on the determination.

10. The damage prediction method according to claim 1, wherein a direction of a normal vector of the third flux of the light arriving at the surface of the processing object is same as a direction of a normal vector of the third flux of the ions arriving at the surface of the processing object.

11. A damage prediction method, comprising:
in an operation apparatus:
calculating a first flux of ions arriving at a surface of a processing object and a first flux of light arriving at the surface of the processing object,
wherein the calculation of the first flux of the ions and the first flux of the light is based on a second flux of the ions generated by plasma and a second flux of the light generated by the plasma;
determining a first damage due to the ions and the light, and a second damage due to the light, wherein
the determination is based on the first flux of the ions, the first flux of the light, and entry lengths of the ions and the light, and
the entry lengths of the ions and the light are from the surface of the processing object; and
calculating a damage distribution of the processing object based on the determination.

12. A damage prediction method, comprising:
in an operation apparatus:
calculating a first flux of ions arriving at a surface of a processing object and a first flux of light arriving at the surface of the processing object,
wherein the calculation of the first flux of the ions and the first flux of the light is based on a second flux of the ions generated by plasma and a second flux of the light generated by the plasma; and
calculating, based on the first flux of the ions and the first flux of the light arriving at the surface of the processing object, a distribution of damage to the processing object,
wherein a direction of a normal vector of the first flux of the light arriving at the surface of the processing object is same as a direction of a normal vector of the first flux of the ions arriving at the surface of the processing object.

13. A non-transitory computer-readable medium having stored thereon computer-executable instructions which, when executed by a computer, cause the computer to execute operations, the operations comprising:
- calculating a first flux of ions propagated through an opening in a mask and a first flux of light propagated through the opening in the mask, wherein
  - the mask is on a surface of a processing object, and
  - the calculation of the first flux of the ions and the first flux of the light is based on a second flux of the ions generated by plasma and a second flux of the light generated by the plasma;
- calculating, by ray-tracing, a third flux of the ions arriving at the surface of the processing object and a third flux of the light arriving at the surface of the processing object,
  - wherein the calculation of the third flux of the ions and the third flux of the light is based on the first flux of the ions and the first flux of the light; and
- calculating, based on the third flux of the ions and the third flux of the light, a distribution of damage to the processing object.

14. A semiconductor processing system, comprising:
- an incident flux operation unit configured to calculate a first flux of ions propagated through an opening in a mask and a first flux of light propagated through the opening in the mask, wherein
  - the mask is on a surface of a processing object, and
  - the calculation of the first flux of the ions and the first flux of the light is based on a second flux of the ions generated by plasma and a second flux of the light generated by the plasma;
- a processing surface flux operation unit configured to calculate, by ray-tracing, a third flux of the ions arrived at the surface of the processing object and a third flux of the light arrived at the arriving at a surface of the processing object,
  - wherein the calculation of the third flux of the ions and the third flux of the light is based on the first flux of the ions and the first flux of the light; and
- a damage operation unit configured to calculate, a damage distribution of the processing object based on the third flux of the ions and the third flux of the light.

15. The semiconductor processing system according to claim 14, further comprising:
- a sensor unit configured to measure a state of an interior of a chamber, wherein the processing object is configured to be processed in the chamber;
- a correction determination unit configured to determine a correction to a processing condition of the processing object, wherein
  - the determination is based on the damage distribution of the processing object, and
  - the calculation of the damage distribution is further based on information measured by the sensor unit; and
- a control unit configured to control the processing condition based on the determined correction.

16. The semiconductor processing system according to claim 15, further comprising a processing stop unit configured to stop process of the processing object in a case where the correction determination unit is unable to determine the correction.

* * * * *